US012448701B2

(12) United States Patent
Takao et al.

(10) Patent No.: US 12,448,701 B2
(45) Date of Patent: Oct. 21, 2025

(54) SINGLE CRYSTAL MANUFACTURING METHOD, SINGLE CRYSTAL MANUFACTURING APPARATUS AND CRUCIBLE

(71) Applicant: Proterial, Ltd., Tokyo (JP)

(72) Inventors: Kenta Takao, Tokyo (JP); Daiki Furukawa, Tokyo (JP); Kenya Tanaka, Tokyo (JP); Mai Abe, Tokyo (JP); Takashi Hasegawa, Tokyo (JP); Toru Umeno, Tokyo (JP)

(73) Assignee: PROTERIAL, LTD., Tokyo (JP)

( * ) Notice: Subject to any disclaimer, the term of this patent is extended or adjusted under 35 U.S.C. 154(b) by 143 days.

(21) Appl. No.: 17/903,196

(22) Filed: Sep. 6, 2022

(65) Prior Publication Data

US 2023/0082972 A1 Mar. 16, 2023

(30) Foreign Application Priority Data

Sep. 10, 2021 (JP) ................................ 2021-147905
Feb. 25, 2022 (JP) ................................ 2022-028347
Jul. 8, 2022 (JP) ................................ 2022-110341

(51) Int. Cl.
*C30B 15/14* (2006.01)
*C30B 15/20* (2006.01)
*C30B 29/36* (2006.01)

(52) U.S. Cl.
CPC .............. *C30B 15/14* (2013.01); *C30B 15/20* (2013.01); *C30B 29/36* (2013.01)

(58) Field of Classification Search
CPC ...................................................... C30B 29/36
See application file for complete search history.

(56) References Cited

U.S. PATENT DOCUMENTS

2014/0245945 A1 9/2014 Kado et al.
2015/0136016 A1* 5/2015 Danno .................... C30B 29/36 117/35
2016/0340795 A1* 11/2016 Domoto .................... C30B 9/06
2018/0312996 A1 11/2018 Doi et al.

FOREIGN PATENT DOCUMENTS

JP H02-217388 A 8/1990
JP H07-025694 A 1/1995
JP 2009227525 A * 10/2009
JP 2012-136388 A 7/2012
JP 2013075771 A * 4/2013 ............. C30B 17/00
JP 5746362 B2 5/2015
JP 2018-184324 A 11/2018

* cited by examiner

*Primary Examiner* — Hua Qi
(74) *Attorney, Agent, or Firm* — McCormick, Paulding & Huber PLLC

(57) ABSTRACT

Miscellaneous crystals generated in a solution are reduced. A single crystal manufacturing method includes a first heating step of heating the solution so that a temperature of the solution in contact with a side surface of a crucible becomes higher than a temperature of the solution in contact with a bottom surface of the crucible, and a second heating step of heating the solution so that the temperature of the solution in contact with the bottom surface of the crucible becomes higher than the temperature of the solution in contact with the side surface of the crucible.

3 Claims, 19 Drawing Sheets

SINGLE CRYSTAL MANUFACTURING METHOD, SINGLE CRYSTAL MANUFACTURING APPARATUS AND CRUCIBLE

CROSS-REFERENCE TO RELATED APPLICATIONS

This application claims foreign priority benefits under U.S.C. § 119 from Japanese Patent Applications No. 2021-147905 filed on Sep. 10, 2021, No. 2022-28347 filed on Feb. 25, 2022, and No. 2022-110341 filed on Jul. 8, 2022, the contents of each of which are hereby incorporated by reference in its entirety.

TECHNICAL FIELD

The present invention relates to a technique of manufacturing a single crystal made of silicon carbide, a single crystal manufacturing apparatus, and a crucible, and relates to, for example, a technique effectively applied to a single crystal manufacturing technique using a solution method.

BACKGROUND

Japanese Patent No. 5746362 (Patent Document 1) describes a technique of controlling a carbon supersaturation degree of a crystal surface by switching a temperature gradient in the solution during growth of the single crystal.

Japanese Patent Application Laid-Open Publication No. 2018-184324 (Patent Document 2) describes a technique of heating a bottom surface of a crucible for a long time.

Japanese Patent Application Laid-Open Publication No. H02-217388 (Patent Document 3) describes a technique of heating a crucible with a side heater and a bottom heater.

Japanese Patent Application Laid-Open Publication No. 2012-136388 (Patent Document 4) describes a technique related to an induction heating apparatus including an upper coil portion disposed around an upper container and a lower coil portion disposed around a lower container.

Japanese Patent Application Laid-Open Publication No. H07-25694 (Patent Document 5) describes a technique related to a crucible having a protrusion protruding out from a bottom surface.

SUMMARY

For example, inverter circuits are used as circuits for controlling motors included in automobiles, household electric appliances, and the like. As such an inverter circuit, a power semiconductor element represented by a power metal oxide semiconductor field effect transistor (MOSFET) and an insulated gate bipolar transistor (IGBT) is used.

Such a power semiconductor element is required to have, for example, a low ON-resistance and a low switching loss in addition to a high withstand voltage. The current mainstream of the power semiconductor element is a field effect transistor formed on a semiconductor substrate made of silicon as a main component, but the power semiconductor element is approaching a theoretical performance limitation.

In regards to this, attention is paid to a semiconductor element (hereinafter referred to as wide band gap power semiconductor element) including a field effect transistor formed on a semiconductor substrate made of a semiconductor material having a larger band gap than that of silicon as a main component.

This is because the large band gap means a high dielectric breakdown strength, and thus, tends to achieve a high withstand voltage.

When the semiconductor material itself has a high dielectric breakdown strength, the withstand voltage can be ensured even if a drift layer for holding the withstand voltage is thinned. Therefore, the ON-resistance of the power semiconductor element can be reduced by, for example, thinning the drift layer and increasing an impurity concentration.

In other words, the wide band gap power semiconductor element is excellent in that both the improvement of the withstand voltage and the reduction of the ON-resistance, which are in a trade-off relationship with each other, can be satisfied. Therefore, the wide band gap power semiconductor element is expected as a semiconductor element capable of achieving high performance.

As the semiconductor material having the larger band gap than that of silicon, for example, silicon carbide (SiC), gallium nitride (GaN), gallium oxide ($Ga_2O_3$), diamond or the like is exemplified. The silicon carbide will be paid attention to and be explained below.

The single crystal made of silicon carbide (hereinafter referred to as silicon carbide single crystal) is manufactured by, for example, using a solution method. The solution method is a method of manufacturing the silicon carbide single crystal by bringing a seed crystal attached to a tip of a shaft into contact with solution including carbon and silicon contained in a crucible, and pulling up the shaft while growing the silicon carbide single crystal on the seed crystal.

Here, in the solution method, it is important to reduce miscellaneous crystal generated in the solution contained in the crucible. This is because attachment of the miscellaneous crystal, that is, for example, aggregate of gathered silicon carbide particles of about 1 mm to 3 mm, to the seed crystal prevents the crystal to be grown on the seed crystal from being a single crystal. Therefore, in the solution method, a contrivance for reducing the miscellaneous crystal generated in the solution is desired in a point of view of growing the silicon carbide single crystal on the seed crystal.

A single crystal manufacturing method according to one embodiment includes: (a) a step of bring a lower surface of a seed crystal into contact with a solution including carbon and silicon contained in a crucible by moving downward a shaft having a seed crystal attached to its tip; and (b) a step of growing a single crystal made of silicon carbide on the lower surface of the seed crystal.

The single crystal manufacturing method described here includes: (c1) a first heating step of heating the solution so that a temperature of the solution in contact with a side surface of the crucible becomes higher than a temperature of the solution in contact with a bottom surface of the crucible; and (c2) a second heating step of heating the solution so that the temperature of the solution in contact with the bottom surface of the crucible becomes higher than the temperature of the solution in contact with the side surface of the crucible, and the first heating step and the second heating step are alternately switched.

In the single crystal manufacturing apparatus according to one embodiment, a crucible containing the solution including carbon and silicon can be placed inside a container. In addition, the single crystal manufacturing apparatus includes: a base placed inside the container; a first heater that heats the crucible arranged on the base; a second heater that heats the base; and a controller that controls power to be supplied to the first heater and power to be supplied to the second heater.

Here, the controller alternately switches a first operation of adjusting the power to be supplied to the first heater and the power to be supplied to the second heater so that the temperature of the solution in contact with the side surface of the crucible becomes higher than the temperature of the solution in contact with the bottom surface of the crucible, and a second operation of adjusting the power to be supplied to the first heater and the power to be supplied to the second heater so that the temperature of the solution in contact with the bottom surface of the crucible becomes higher than the temperature of the solution in contact with the side surface of the crucible.

A crucible according to one embodiment can contain solution including carbon and silicon. Here, the crucible includes: a main body that contains the solution; and a heat transfer member that protrudes out from a bottom of the main body.

One embodiment can reduce miscellaneous crystal generated in the solution.

BRIEF DESCRIPTIONS OF THE DRAWINGS

DETAILED DESCRIPTION

Figure 1:
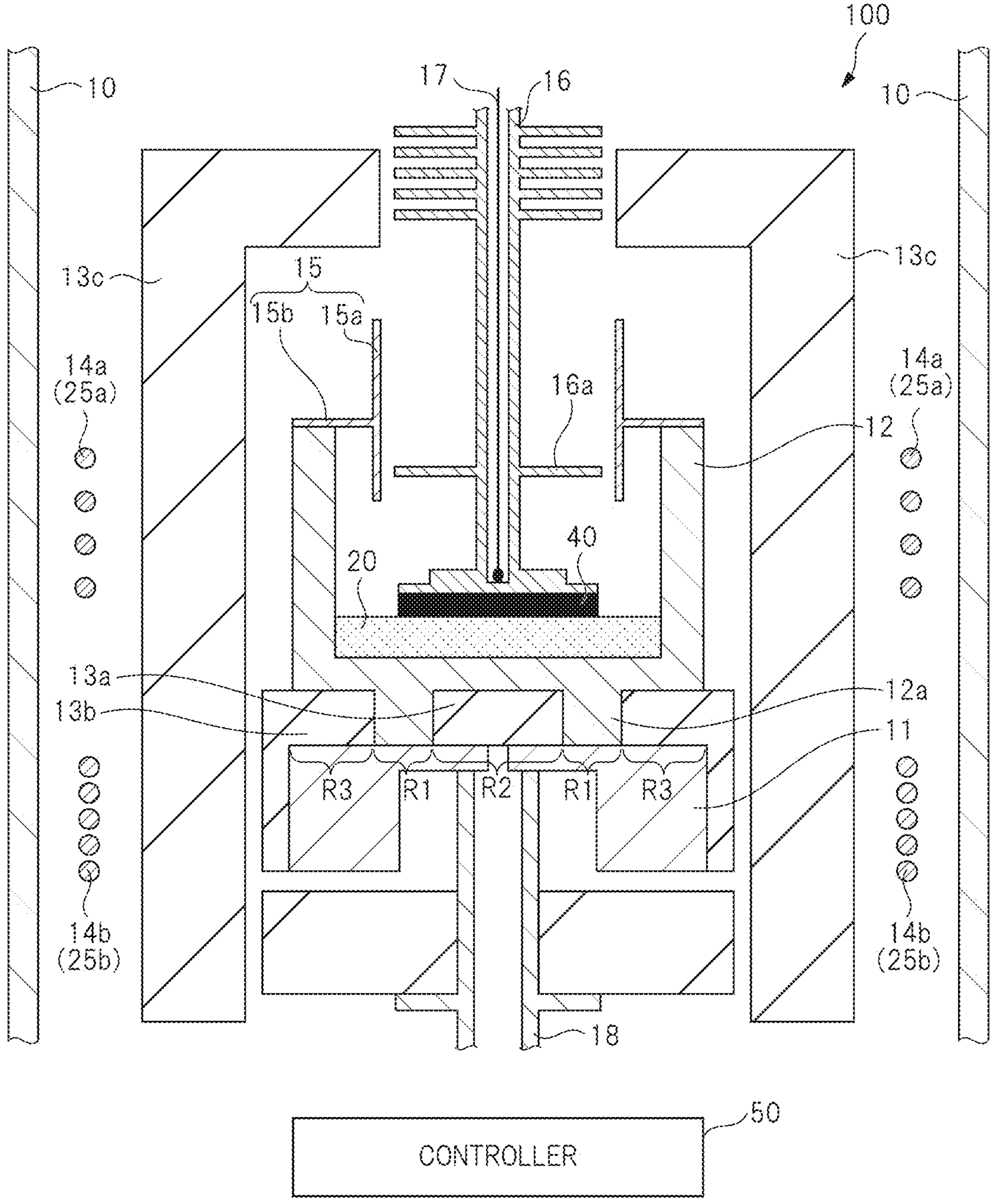
FIG. 1 is a diagram showing a configuration of a single crystal manufacturing apparatus according to an embodiment.

The same components are denoted by the same reference signs in principle throughout all the drawings for explaining the embodiments, and the repetitive description thereof will be omitted. Note that hatching may be used even in a plan view so as to make the drawings easy to see.

Consideration of Improvement

When a silicon carbide single crystal is grown by a solution method, it is necessary to create a supersaturation state in a solution in order to precipitate the crystal. Therefore, temperature gradient is formed in the solution in order to create the supersaturation state in the solution method for growing the silicon carbide single crystal. In this case, a high temperature region and a low temperature region are formed in the solution, and the supersaturation state is achieved in the low temperature region. Thus, the crystal can be grown on the seed crystal by forming the temperature gradient in the solution so that a region of the solution in contact with the seed crystal is the low temperature region where the supersaturation state is achieved.

When a crystal having the same structure and the same orientation as those of the seed crystal is grown on the surface of the seed crystal, a desirable silicon carbide single crystal is grown from the seed crystal serving as a starting point. On the other hand, a grown crystal having a different structure or orientation from the structure or the orientation of the seed crystal is referred to as miscellaneous crystal even when being the grown crystal on the surface of the seed crystal, and growth of the miscellaneous crystal on the surface of the seed crystal inhibits the growth of the silicon carbide single crystal. Therefore, in the solution method, a contrivance for reducing the miscellaneous crystal generated in the solution is desired in a point of view of growing the silicon carbide single crystal on the seed crystal.

Furthermore, such a miscellaneous crystal includes not only the miscellaneous crystal directly generated on the surface of the seed crystal, but also a miscellaneous crystal, a core of which is generated on a side wall or a bottom surface of the crucible and is attached to and grown on the seed crystal while floating in the solution.

Such a miscellaneous crystal becomes a cause of inhibiting the growth of the silicon carbide single crystal grown from the seed crystal serving as the starting point, and thus, is desirably suppressed from attaching to the seed crystal. In other words, the miscellaneous crystal is basically allowed to be generated on the side wall or the bottom surface itself of the crucible instead of the seed crystal. However, if the miscellaneous crystal generated on the side wall or the bottom surface of the crucible becomes enormous, a part of the enormous miscellaneous crystal highly possibly separates and floats in the solution. Thus, in order to reduce the miscellaneous crystal floating in the solution and attaching to the seed crystal, it is desirable to suppress the enormous miscellaneous crystal generated on the side wall or the bottom surface of the crucible. Furthermore, the enormous miscellaneous crystal generated on the side wall or the bottom surface of the crucible becomes a cause leading to reduction in a raw material used for growing the silicon carbide single crystal on the seed crystal and reduction in a growing speed of the silicon carbide single crystal.

Therefore, when the silicon carbide single crystal is grown by the solution method, it is necessary to suppress the enormous miscellaneous crystal generated on the side wall or the bottom surface of the crucible. Accordingly, the present embodiment adopts a contrivance capable of reducing the miscellaneous crystal generated in the solution and suppressing the enormous miscellaneous crystal generated on the side wall or the bottom surface of the crucible.

A technical idea of the present embodiment adopting the contrivance will be explained below.

Basic Idea of Embodiment

As described above, in the technique of growing the silicon carbide single crystal by the solution method, it is necessary to create the supersaturation state in the solution in order to precipitate the crystal, and the temperature gradient is formed in the solution in order to create such this supersaturation state. Therefore, the solution contained in the crucible has mixture of the high temperature region and the low temperature region, and the crystal precipitates in the low temperature region while the crystal does not precipitate in the high temperature region. Thus, it is conceivable (findings) that, for example, change of the low temperature region where the crystal precipitates to the high temperature region makes the precipitated crystal dissolve again.

The present inventors have paid attention to the findings, and have contrived a basic idea capable of reducing the miscellaneous crystal generated in the solution and suppressing the enormous miscellaneous crystal generated on the side wall and the bottom surface of the crucible. Therefore, this basic idea will be explained below.

The basic idea of the present embodiment is an idea of changing the low temperature region where the miscellaneous crystal precipitates to the high temperature region to make the precipitated miscellaneous crystal dissolve by switching the high temperature region and the low temperature region contained in the crucible. This basic idea can suppress the continuous precipitation of the miscellaneous crystal, and, as a result of this, can reduce the miscellaneous crystal and suppress the enormous miscellaneous crystal.

Specifically, basically assuming that the miscellaneous crystal is generated on the side wall or the bottom surface of the crucible, the basic idea of the present embodiment can be said as an idea including a first heating step of heating the solution so that the temperature of the solution in contact with the side surface of the crucible becomes higher than the temperature of the solution in contact with the bottom surface of the crucible, and a second heating step of heating the solution so that the temperature of the solution in contact with the bottom surface of the crucible becomes higher than the temperature of the solution in contact with the side surface of the crucible, and alternately switching the first heating step and the second heating step.

According to the basic idea, in the first heating step, the miscellaneous crystal precipitates on the bottom surface of the crucible while the miscellaneous crystal precipitated on the side surface of the crucible dissolves. On the other hand, in the second heating step, the miscellaneous crystal precipitated on the bottom surface of the crucible dissolves while the miscellaneous crystal precipitates on the side surface of the crucible. As a result, by alternately switching the first heating step and the second heating step, the miscellaneous crystal is not continuously precipitated. Thus, the basic idea can reduce the miscellaneous crystal and suppressing the enormous miscellaneous crystal. A single crystal manufacturing technique embodying this basic idea will be explained below.

Configuration of Single Crystal Manufacturing Apparatus

FIG. 1 is a diagram showing a configuration of a single crystal manufacturing apparatus 100 according to the present embodiment.

In FIG. 1, the single crystal manufacturing apparatus 100 includes a container 10. An internal space of the container 10 is filled with, for example, argon gas. In addition, a heat insulating member 13*c* is provided inside the container 10, and a base 11 that is rotatable in a horizontal direction is disposed on an inner side surrounded by the heat insulating member 13*c*. The container 10 is made of, for example, an iron-based material such as SUS.

Note that a structure filled with the argon gas adopts, for example, a structure filled with the argon gas made by closing upper and lower ends of a silica tube with a flange, the silica tube penetrating between the heat insulating member 13*c* and a coil 14*a* and between the heat insulating member 13*c* and a coil 14*b*.

Next, a crucible 12 is disposed on the base 11. The crucible 12 is made of, for example, graphite, and contains high-temperature solution 20 including silicon (Si) therein. Specifically, the crucible 12 includes a main body capable of containing the solution 20 including carbon and silicon, and a heat transfer member 12*a* protruding out from a bottom of the main body.

In the crucible 12 made as described above, the heat transfer member 12*a* also functions as a "leg member", and thus it can be said that the heat transfer member 12*a* also has a secondary function of stably standing the crucible 12. The heat transfer member 12*a* is configured to be in contact with the base 11 on which the crucible 12 can be disposed. For example, as shown in FIG. 1, the base 11 includes a first region R1 in contact with the heat transfer member 12*a*, a second region R2 surrounded by the first region R1, and a third region R3 surrounding the first region R1, and a heat insulating member 13*a* is provided to be in contact with the second region R2 while a heat insulating member 13*b* is provided to be in contact with the third region R3.

The base 11 is connected to a crucible holding shaft 18 that holds the base 11. The crucible holding shaft 18 is configured to be movable in an up-down direction, and is also configured to be rotatable both clockwise and counterclockwise. Thus, the base 11 attached to the crucible holding shaft 18 as well as the crucible 12 disposed on the base 11 can be moved in the up-down direction and can be rotated in the horizontal direction by the crucible holding shaft 18. Note that the crucible holding shaft 18 is hollowed inside so that a thermocouple or a radiation thermometer can be inserted therein to allow temperature measurement.

An outer periphery of the container 10 of the single crystal manufacturing apparatus 100A is provided with a coil through which a high frequency current flows, and the crucible 12 is heated by induction heating based on the high frequency current flowing through the coil. Specifically, the single crystal manufacturing apparatus 100 includes a heater 25*a* and a heater 25*b*. The heater 25*a* is configured to heat the crucible 12 by using induction heating phenomenon that is caused by the flow of the high frequency current through the coil 14*a* provided at a position facing the side surface of the crucible 12. That is, the coil 14*a* functions as the heater 25*a* for heating the crucible 12, and thus, FIG. 1 shows the coil 14*a* together with the heater 25*a*. On the other hand, the heater 25*b* is configured to heat the base 11 by using induction heating phenomenon that is caused by the flow of the high frequency current through the coil 14*b* provided at a position facing the base 11 supporting the crucible 12. The crucible 12 is heated by the heat transfer from the heated base 11. Specifically, the heat is transferred from the base 11 heated by the heater 25*b* to the heat transfer member 12*a*, and then, the heat is transferred from the heat transfer member 12*a* to the crucible 12 (main body) to heat the crucible 12. Thus, the heater 25*b* is configured to indirectly heat the crucible 12 through the base 11 by using the induction heating phenomenon that is caused by the flow of the high frequency current through the coil 14*b* provided at the position facing the base 11 supporting the crucible 12. Therefore, the coil 14*b* functions as the heater 25*b* for heating the crucible 12, and thus, FIG. 1 shows the coil 14*b* together with the heater 25*b*. Although not shown in FIG. 1, the coil 14*b* and the coil 14*a* are configured to be able to flow a coolant therein.

Therefore, the single crystal manufacturing apparatus 100 is configured to heat the crucible 12 itself by not only using the heater 25*a* but also the heat transfer from the base 11 heated by the heater 25*b*, and thus, it can be said that the heat transfer member 12*a* of the crucible 12 has a heat transfer function of the heat from the base 11 heated by the heater 25*b* to the main body.

Here, in order to easily heat the base 11 by the heater 25*b*, the base 11 is thickened to make its portion facing the coil 14*b* large. The base 11 can be unified with the crucible 12. However, the base 11 and the crucible 12 are desirably configured as separate bodies in consideration of necessity to replace the crucible 12 for every manufacturing of the silicon carbide single crystal and consideration of a high manufacturing cost of the unified bodies. When the base 11 and the crucible 12 are configured as separate bodies, the heat transfer member 12*a* of the crucible 12 may be simply disposed on the base 11 or the base 11 may be configured so that the heat transfer member 12*a* can be fitted into the base 11.

These heaters 25*a* and 25*b* are controlled by a controller 50. In other words, the single crystal manufacturing apparatus 100 includes the controller 50 that controls the power to be supplied to the heater 25*a* and the power to be supplied to the heater 25*b*. For example, a power supply for supplying the power to the heater 25*a* and a power supply for supplying the power to the heater 25*b* are different power supplies from each other, and the controller 50 is configured to be able to individually control the heater 25*a* and the heater 25*b* having the different power supplies.

The controller 50 is configured to be able to alternately switch between a first operation of adjusting the power to be supplied to the heater 25*a* and the power to be supplied to the heater 25*b* so that the temperature of the solution 20 in contact with the side surface of the crucible 12 becomes higher than the temperature of the solution 20 in contact with the bottom surface of the crucible 12, and a second operation of adjusting the power to be supplied to the heater 25*a* and the power to be supplied to the heater 25*b* so that the temperature of the solution 20 in contact with the bottom surface of the crucible 12 becomes higher than the temperature of the solution 20 in contact with the side surface of the crucible 12.

A temperature of the solution 20 contained in the crucible 12 heated by the heater 25*a* and the heater 25*b* is high, and the graphite (C) configuring the crucible 12 dissolves, and therefore, the solution 20 includes carbon and silicon. A crucible lid 15 is attached to the crucible 12, and the crucible lid 15 includes a tubular member 15*a* and a connecting member 15*b* connected to the tubular member 15*a*. The connecting member 15*b* has a function of fixing and supporting the tubular member 15*a*, and is configured to, for example, be able to come into contact with the crucible 12.

Next, the single crystal manufacturing apparatus 100 is provided with a crystal holding shaft 16 movable in the up-down direction. As similarly to the crucible holding shaft 18, the crystal holding shaft 16 may also be configured to be rotatable clockwise direction or counterclockwise. That is, the crystal holding shaft 16 and the crucible holding shaft 18 optionally have a rotation mechanism.

A seed crystal (not shown in FIG. 1) made of silicon carbide is attached to a tip of the crystal holding shaft 16. In addition, the crystal holding shaft 16 has a fin structural body 16*a* attached to intersect an extending direction of the crystal holding shaft 16. Furthermore, the crystal holding shaft 16 is hollowed inside, and a thermocouple 17 for measuring the temperature in the vicinity of the seed crystal is inserted inside the crystal holding shaft 16. The temperature in the vicinity of the seed crystal may be also measured by disposing a radiation thermometer having a smaller measurement diameter than an inner diameter of the crystal holding shaft 16 at an upper end of the crystal holding shaft 16, instead of inserting the thermocouple 17.

The controller 50 of the single crystal manufacturing apparatus 100 is also configured to control the crystal holding shaft 16 having the fin structural body 16*a* to move in the up-down direction. Specifically, the controller 50 is configured to control the crystal holding shaft 16 to move the crystal holding shaft 16 having the fin structural body 16*a* in the up-down direction while passing inside the tubular member 15*a*. The controller 50 is configured to bring the lower surface of the seed crystal into contact with the surface of the solution 20 contained in the crucible 12 by moving downward the crystal holding shaft 16 having the tip to which the seed crystal is attached, and is also configured to be able to grow the single crystal made of silicon carbide on the lower surface of the seed crystal by moving the crystal holding shaft 16 upward after bringing the lower surface of the seed crystal into contact with the surface of the solution 20. For example, FIG. 1 shows a silicon carbide single crystal 40 grown on the lower surface of the seed crystal. Note that the seed crystal merely needs to be brought into contact with the solution 20. However, the seed crystal is particularly desirable to be brought into contact with the surface of the solution 20.

The configuration enabling the single crystal made of silicon carbide to be grown on the lower surface of the seed crystal by moving the crystal holding shaft 16 upward is an example. For example, the single crystal made of silicon carbide may be grown on the lower surface of the seed crystal in a state in which the crystal holding shaft 16 is stopped (maintained), or the single crystal made of silicon carbide may be grown on the lower surface of the seed crystal by moving the crystal holding shaft 16 downward. This configuration is made in consideration of a case in which, for example, the surface of the solution 20 is lowered by vaporization of the solution 20. In other words, in the case in which the surface of the solution 20 is recessed by the vaporization of the solution 20, the single crystal can be reliably grown on the seed crystal by the growth of the single crystal along with the downward movement of the crystal holding shaft 16.

The single crystal manufacturing apparatus 100 is configured as described above.

Figure 2:
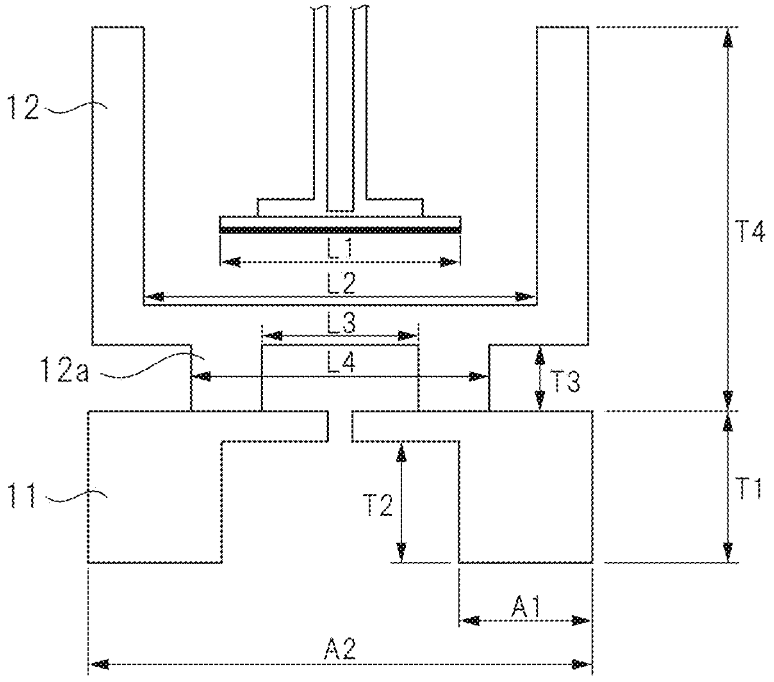
FIG. 2 is a diagram for explaining a dimension example of respective main portions of a base and a crucible.

FIG. 2 is a diagram for explaining a dimension example of the respective main portions of the base 11 and the crucible 12.

The dimensions of the main portions shown in FIG. 2 are, for example, as follows:

(1) "L1"=ϕ150 mm
(2) "L2"=ϕ250 mm
(3) "L3"=ϕ100 mm
(4) "L4"=ϕ190 mm
(5) "T1"=100 mm
(6) "T2"=80 mm
(7) "T3"=30 mm
(8) "T4"=250 mm
(9) "A1"=90 mm
(10) "A2"=ϕ330 mm

First Modification Example

In the single crystal manufacturing apparatus 100 shown in FIG. 1, the case in which the heater 25*b* for heating the base 11 uses the induction heating phenomenon that is caused by the flow of the high frequency current through the coil 14*b* is exemplified. However, the heater 25*b* for heating the base 11 is not limited to this case, and may be made of, for example, a resistive heater below the base 11.

However, when the heater 25*b* is made of the resistive heater, a "hole" needs to be provided in a heat insulating material in order to draw a pair of wirings used to energize the resistive heater. In particular, when the crucible 12 itself is configured to be rotatable, a circumferential opening needs to be provided in the heat insulating material in order to draw the pair of wirings. As a result, it may become difficult to ensure a high-temperature holding property of the crucible 12. Therefore, in a point of view of enhancing the heat insulating effect of the heat insulating material and a point of view of simplifying the configuration of the single crystal manufacturing apparatus 100, the heater 25*b* for heating the base 11 is desirably made of the induction heater using the induction heating phenomenon as shown in FIG. 1.

Operation of Single Crystal Manufacturing Apparatus (Single Crystal Manufacturing Method)

Next, the operation of the single crystal manufacturing apparatus 100 will be explained.

Figure 3:
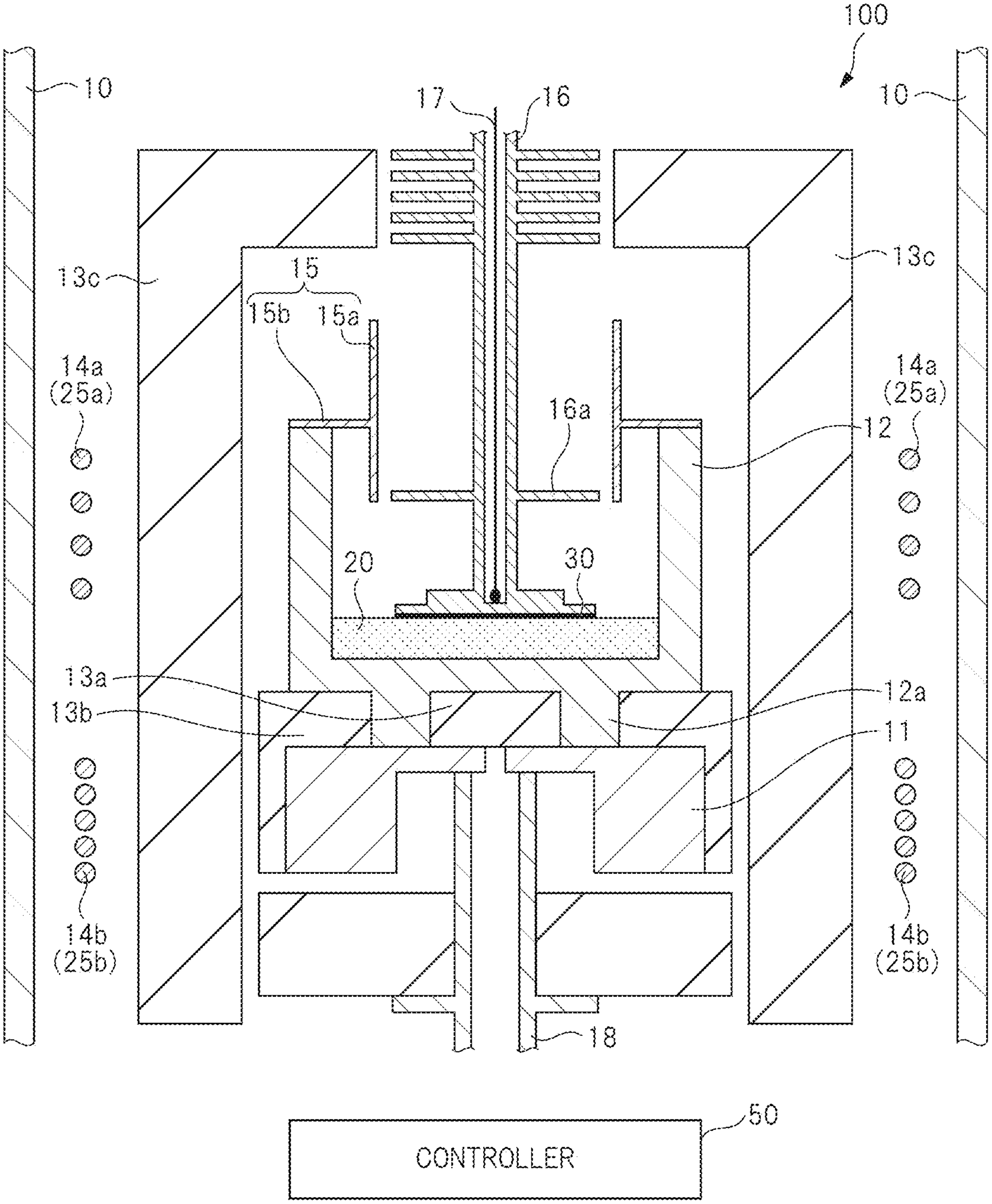
FIG. 3 is a diagram for explaining an operation of the single crystal manufacturing apparatus.
Figure 4:
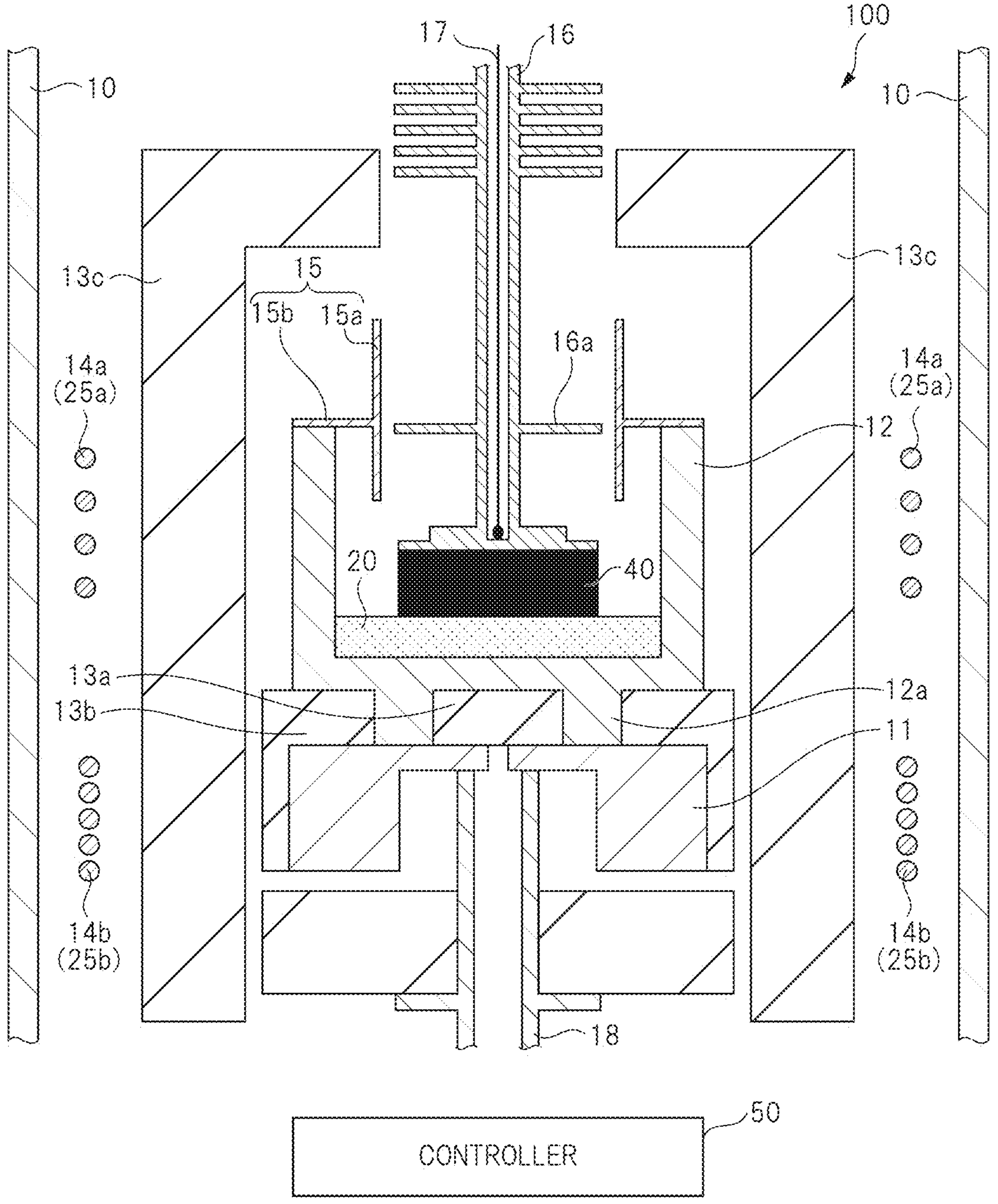
FIG. 4 is a diagram for explaining an operation of the single crystal manufacturing apparatus.

FIGS. 3 and 4 are diagrams for explaining the operation of the single crystal manufacturing apparatus 100.

In FIG. 3, first, the controller 50 moves the crystal holding shaft 16 having the tip to which the seed crystal 30 is attached, downward. Thus, the seed crystal 30 attached to the crystal holding shaft 16 passes through the inside of the tubular member 15*a* of the crucible lid 15, and then, comes into contact with the surface of the solution 20 including carbon and silicon contained in the crucible 12. At this time, the fin structural body 16*a* attached to the crystal holding shaft 16 is disposed at a position facing an inner wall of the tubular member 15*a*.

Next, in FIG. 4, the controller 50 slowly moves the crystal holding shaft 16 upward. In this manner, the silicon carbide single crystal 40 is grown on the lower surface of the pulled-up seed crystal 30. At this time, the fin structural body 16*a* attached to the crystal holding shaft 16 moves while keeping facing the inner wall of the tubular member 15*a*. Then, if the crystal growth is continued, the pull-up operation of the crystal holding shaft 16 is continued. On the other hand, if the crystal growth is ended, the controller 50 further pulls up the crystal holding shaft 16, and separates the silicon carbide single crystal 40 from the solution 20. In this manner, the growth of the silicon carbide single crystal 40 is ended. At this time, the fin structural body 16*a* attached to the crystal holding shaft 16 keeps in a state of being disposed at the position facing the inner wall of the tubular member 15*a*.

As described above, the silicon carbide single crystal can be manufactured by operating the single crystal manufacturing apparatus 100. Note that the end of the crystal growth by further pulling up the crystal holding shaft 16 to separate the silicon carbide single crystal 40 from the solution 20 has been described. However, the present invention is not limited to this. For example, the crystal growth can be ended by pulling down the crucible holding shaft 18 instead of pulling up the crystal holding shaft 16 to separate the silicon carbide single crystal 40 from the solution 20.

Operation by Controller

As described above, in the single crystal manufacturing apparatus 100, the silicon carbide single crystal is manufactured by the "solution method". At this time, in the single crystal manufacturing method in the present embodiment, the first heating step and the second heating step are alternately switched, the first heating step heating the solution 20 so that the temperature of the solution 20 in contact with the side surface of the crucible 12 becomes higher than the temperature of the solution 20 in contact with the bottom surface of the crucible 12, and the second heating step heating the solution 20 so that the temperature of the solution 20 in contact with the bottom surface of the crucible 12 becomes higher than the temperature of the solution 20 in contact with the side surface of the crucible 12.

In the present embodiment, these steps are achieved by the control for the heater 25*a* and the heater 25*b* by the controller 50 of the single crystal manufacturing apparatus 100. Specifically, the controller 50 alternately switches the first operation of making the temperature of the solution 20 in contact with the side surface of the crucible 12 to be higher than the temperature of the solution 20 in contact with the bottom surface of the crucible 12 by adjusting the power to be supplied to the heater 25*a* and the power to be supplied to the heater 25*b*, and the second operation of making the temperature of the solution 20 in contact with the bottom surface of the crucible 12 to be higher than the temperature of the solution 20 in contact with the side surface of the crucible 12 by adjusting the power to be supplied to the heater 25*a* and the power to be supplied to the heater 25*b*.

For example, when the first operation is performed by the controller 50, the temperature of the solution 20 in contact with the side surface of the crucible 12 is a temperature at which the miscellaneous crystal dissolves, and the temperature of the solution 20 in contact with the bottom surface of the crucible 12 is a temperature at which the miscellaneous crystal precipitates. On the other hand, when the second operation by the controller 50 is performed, the temperature of the solution 20 in contact with the bottom surface of the crucible 12 is a temperature causing dissolution of the miscellaneous crystal, and the temperature of the solution 20 in contact with the side surface of the crucible 12 is a temperature causing precipitation of the miscellaneous crystal.

Thus, the precipitated miscellaneous crystal can be dissolved again by the repetitive switching between the first operation and the second operation, and, as a result, the miscellaneous crystal is not continuously precipitated, and thus, the miscellaneous crystal can be reduced, and the enormous miscellaneous crystal can be suppressed.

Figure 5:
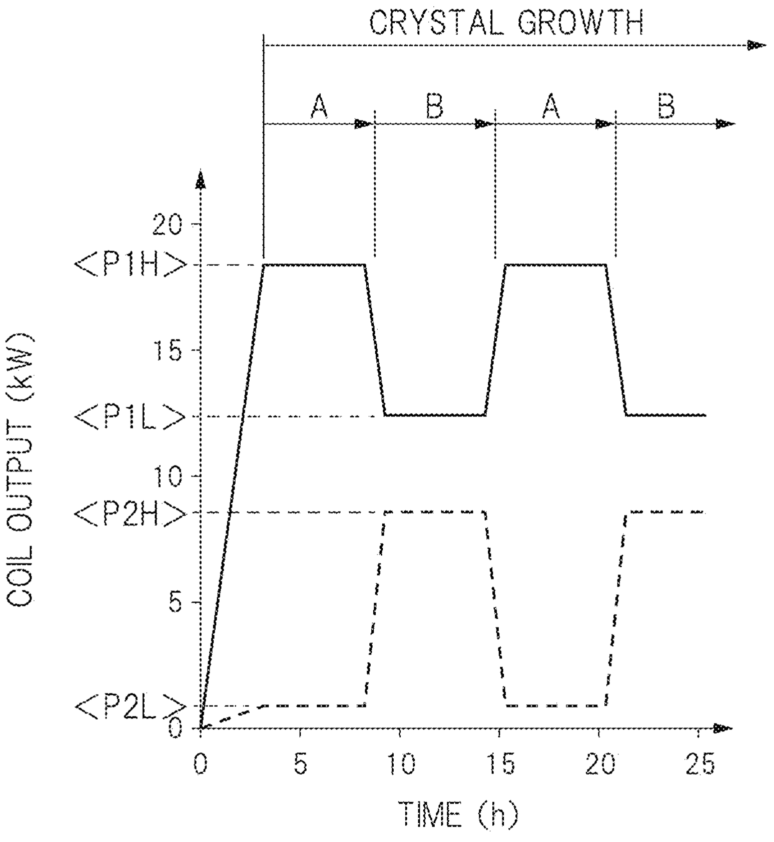
FIG. 5 is a diagram showing an example of switching between a first operation and a second operation switched by a controller.

FIG. 5 is a diagram showing an example of the switching between the first operation and the second operation switched by the controller 50.

In FIG. 5, a term "A" indicates a period in which the first operation is performed, and a term "B" indicates a period in which the second operation is performed. In FIG. 5, a solid line indicates a power (coil output) supplied to the coil 14*a* of the heater 25*a*. On the other hand, a broken line indicates a power (coil output) supplied to the coil 14*b* of the heater 25*b*.

In FIG. 5, the first operation ("A") and the second operation ("B") are switched along with the crystal growth. That is, FIG. 5 shows an example of the repetitive switching between the first operation and the second operation in the step (see FIG. 4) of growing the silicon carbide single crystal 40 on the lower surface of the seed crystal while moving the crystal holding shaft 16 upward.

For example, in the first operation, the power supplied to the coil 14*a* is large while the power supplied to the coil 14*b* is small. This means that a heating amount on the side surface of the crucible 12 is larger than a heating amount on the bottom surface of the crucible 12, and this manner achieves a temperature distribution in which the temperature of the solution 20 in contact with the side surface of the crucible 12 is higher than the temperature of the solution 20 in contact with the bottom surface of the crucible 12. On the other hand, in the second operation, the power supplied to the coil 14*a* is small while the power supplied to the coil 14*b* is large. This means that the heating amount on the bottom surface of the crucible 12 is larger than the heating amount on the side surface of the crucible 12, and this manner achieves a temperature distribution in which the temperature of the solution 20 in contact with the bottom surface of the crucible 12 is higher than the temperature of the solution 20 in contact with the side surface of the crucible 12.

Note that FIG. 5 shows an example in which the power supplied to the coil 14*a* is larger than the power supplied to the coil 14*b* in not only the first operation but also the second operation. However, depending on the configuration of the crucible 12, it is assumed that the power supplied to the coil 14*a* is made smaller than the power supplied to the coil 14*b* in order to achieve the temperature distribution in which the temperature of the solution 20 in contact with the bottom surface of the crucible 12 is higher than the temperature of the solution 20 in contact with the side surface of the crucible 12. In other words, in the second operation, the magnitude relation between the power (or current) supplied to the coil 14*a* and the power (or current) supplied to the coil 14*b* is not relevant as long as the temperature distribution in which the temperature of the solution 20 in contact with the bottom surface of the crucible 12 is higher than the temperature of the solution 20 in contact with the side surface of the crucible 12 is achieved.

Since all members configuring the single crystal manufacturing apparatus 100 have heat capacity, the change of the temperature distribution of the solution 20 delays from the change of all control conditions including the adjustment of the power supplied to each of the coil 14*a* and the coil 14*b*. A period during the change of the temperature distribution of the solution 20 is not always a suitable state for the single crystal growth.

For example, if the switching from the first operation to the second operation is assumed so that a change time from end of a condition of the first operation to a steady state of the temperature distribution of the solution 20 achieved by the second operation is a first change time, a temperature distribution different from both the temperature distribution achieved by the first operation and the temperature distribution achieved by the second operation is achieved in the first change time.

There are a plurality of types of methods for controlling the temperature distribution of the solution 20 in the first change time to be in a desired state. The first example is a method of immediately shifting to the second operation after the end of the first operation. This method achieves the temperature distribution of the solution 20 achieved by the second operation in a short time, and thus, has an advantage in that the silicon carbide single crystal can be grown under a stable condition over a longer time, and is particularly effective to a single crystal manufacturing apparatus having small heat capacity. Furthermore, this method has a simpler and clearer power control condition than those of a second example and a third example described later, and achievement of the method by a single crystal manufacturing apparatus without a complex control mechanism is also one of the advantages.

The second example is a method of causing the change of the power supplied to each of the coil 14*a* and the coil 14*b* to be more gradual as the change delay due to the heat capacity is more absorbed, in a period from the end of the first operation to the start of the second operation. This method has advantages in that the temperature distribution of the solution 20 in the first change time can be meta-stably changed, and in that the temperature distribution of the solution 20 can be mostly controlled by the power supplied to each of the coil 14*a* and the coil 14*b*. As a result, the first change time mostly coincide with the period from the end of the first operation to the start of the second operation, and thus, achievement of the suitable temperature distribution for the growth of the silicon carbide single crystal in the first change time is easier than those of the first example and the third example described later.

Regarding a changing process of the power of the second example, a method for maintaining a power changing speed constant in the period from the end of the first operation to the start of the second operation as shown in FIG. 5 is considerable. Meanwhile, the power changing speed may be increased or decreased at one time point or two or more time points in the period between the end of the first operation and the start of the second operation. The features of the coil 14*a* and the coil 14*b* are to be independently controlled, and therefore, for example, one of the power changing speeds in the latter one can be adjusted to be larger than that of the first example while the other power changing speed can be adjusted to be smaller than that of the first example.

The third example is a method of making the power supplied to the coil 14*a* in a certain period time between the end of the first operation and the start of the second operation to be smaller than the power supplied to the coil 14*a* under the second operation condition, and at the same time, making the power supplied to the coil 14*b* to be larger than the power supplied to the coil 14*b* under the second operation condition. This method is called overshoot, and has an effect of canceling the state change delay due to the heat capacity. The advantage of the power changing method using the overshoot is to make the temperature distribution of the solution 20 achieved by the second operation steady faster than the first example, in a single crystal manufacturing apparatus having a large heat capacity.

Up to now, with regards to the switching from the first operation to the second operation, the method for controlling the temperature distribution of the solution 20 in the first change time to be in the desirable state has been described. However, it goes without saying that the similar method is also applicable to the switching from the second operation to the first operation.

Figure 6:
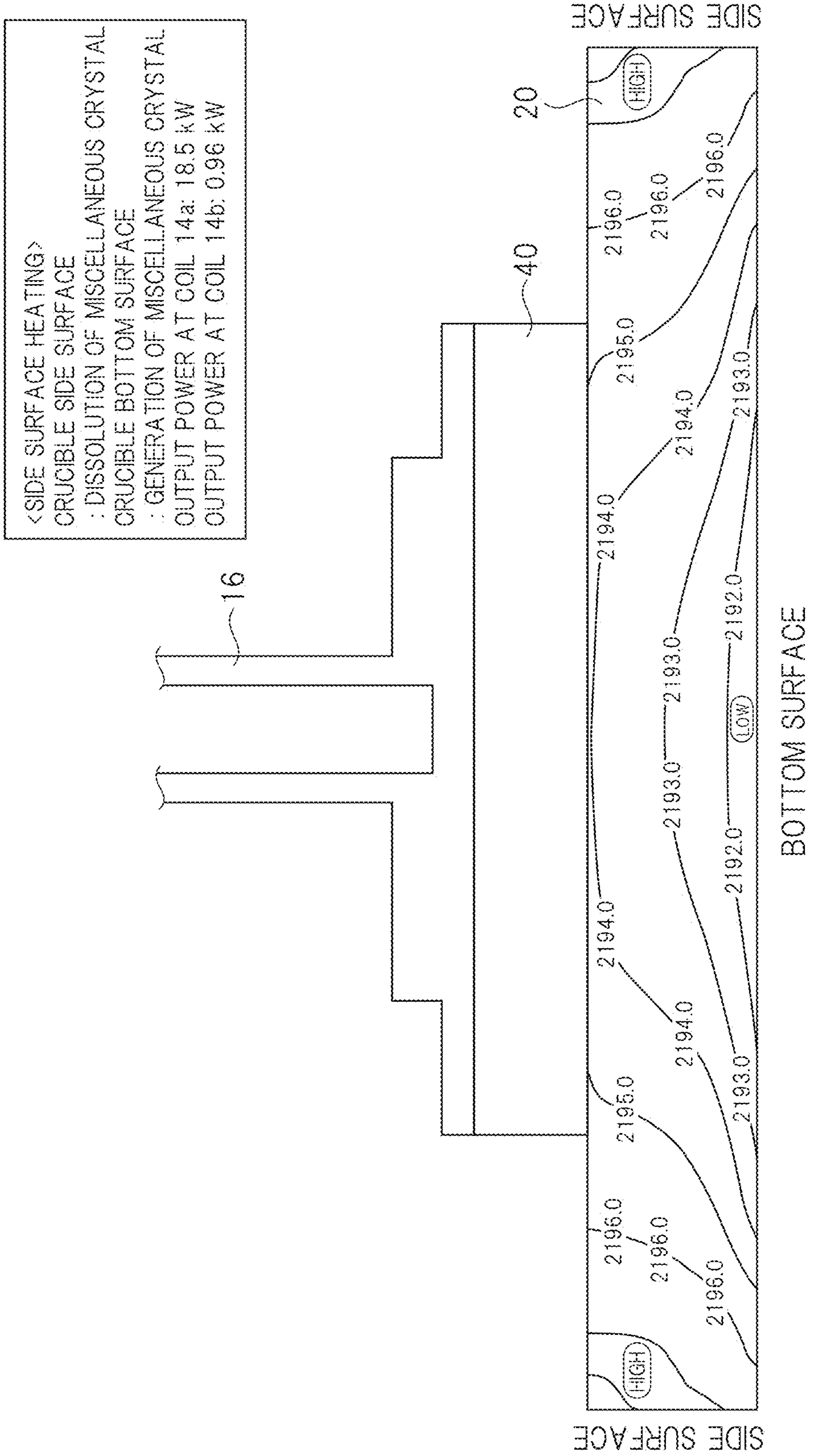
FIG. 6 is a diagram showing a temperature distribution of a solution achieved by the first operation.

FIG. 6 is a diagram showing a result of simulation of the temperature distribution of the solution 20 achieved by the first operation. Note that a software that is called "CGSim" <Crystal growth analysis simulation software> (str-soft-.co.jp) produced by STR Japan K.K. is used for the simulation.

From FIG. 6, it can be seen that the temperature distribution in which the temperature (K) of the solution 20 in contact with the side surface of the crucible is higher than the temperature (K) of the solution 20 in contact with the bottom surface of the crucible is achieved. At this time, the temperature of the solution 20 in contact with the side surface of the crucible is high, and thus, the miscellaneous crystal dissolves. On the other hand, the temperature of the solution 20 in contact with the bottom surface of the crucible is low, and thus, the miscellaneous crystal is generated (precipitated).

Figure 7:
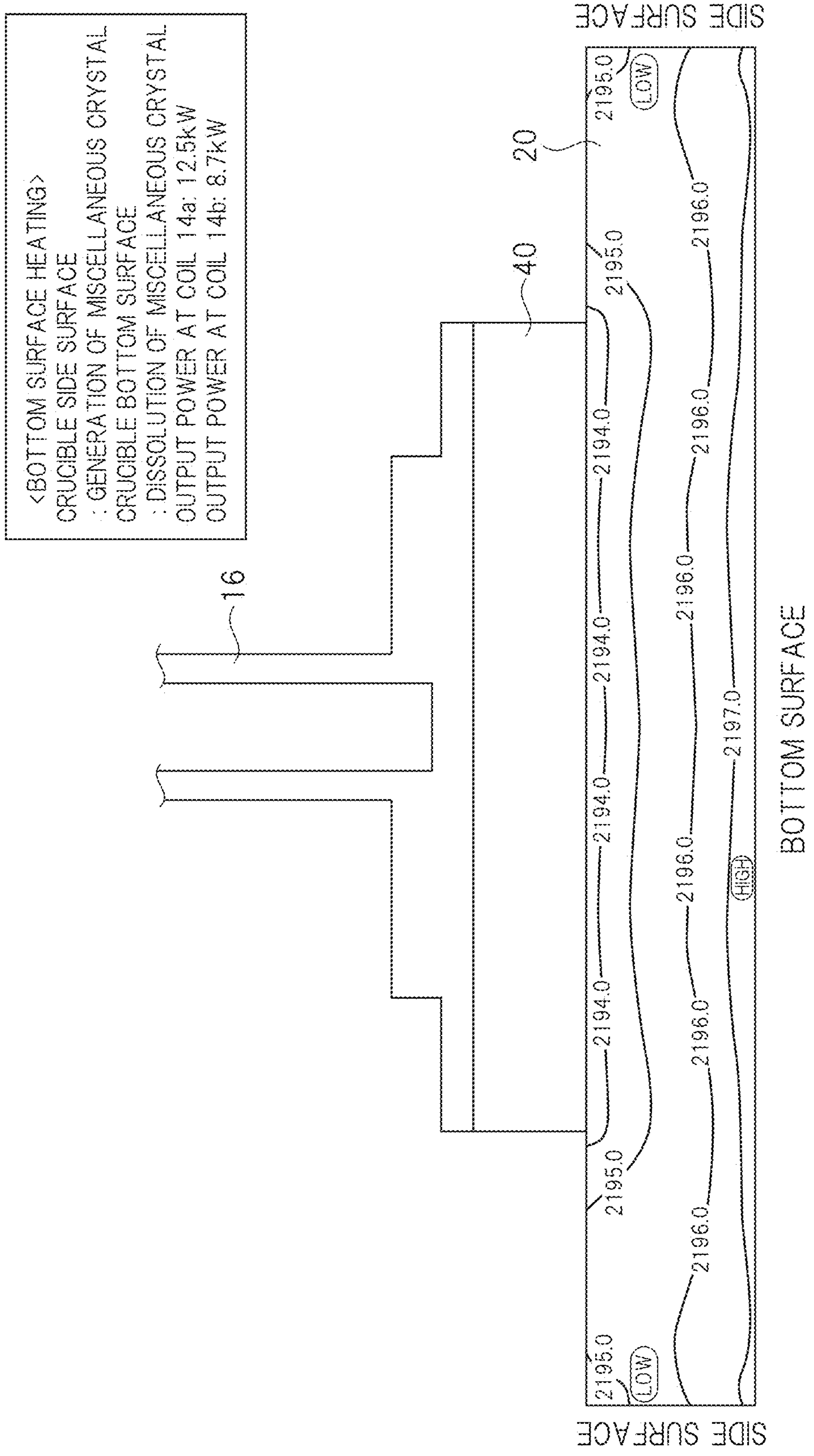
FIG. 7 is a diagram showing a temperature distribution of a solution achieved by the second operation.

FIG. 7 is a diagram showing a result of simulation of the temperature distribution of the solution 20 achieved by the second operation. From FIG. 7, it can be seen that the temperature distribution in which the temperature (K) of the solution 20 in contact with the bottom surface of the crucible is higher than the temperature (K) of the solution 20 in contact with the side surface of the crucible is achieved. At this time, the temperature of the solution 20 in contact with the bottom surface of the crucible is high, and thus, the miscellaneous crystal dissolves. On the other hand, the temperature of the solution 20 in contact with the side surface of the crucible is low, and thus, the miscellaneous crystal is generated (precipitated).

Therefore, by the repetitive alternate switching between the first operation and the second operation, the temperature distribution shown in FIG. 6 and the temperature distribution shown in FIG. 7 are alternately switched. As a result, the re-dissolving phenomenon of the precipitated miscellaneous crystal occurs, and the miscellaneous crystal is not continuously precipitated, and thus, the present embodiment can reduce the miscellaneous crystal and suppress the enormous miscellaneous crystal.

Next, a timing of the switching between the first operation and the second operation will be explained.

Ideally, the switching between the first operation and the second operation is desirable when a size of the miscellaneous crystal exceeds a predetermined size. This is because the enormous miscellaneous crystal can be effectively suppressed when the switching timing is determined as described above.

However, it is difficult to measure the size of the miscellaneous crystal during the step of manufacturing the silicon carbide single crystal. Thus, the control method that is the switching between the first operation and the second operation switched when the size of the miscellaneous crystal exceeds the predetermined size is not practical. Therefore, for example, the alternate switching between the first operation and the second operation at a preset time interval is practical.

Here, in order to effectively suppress the enormous miscellaneous crystal in the case of the alternate switching between the first operation and the second operation at the preset time interval, for example, setting of an optimum time interval is conceivable, the setting being based on data accumulated in a built database that accumulates the data indicating a relationship between the time interval and the miscellaneous crystal size.

Second Modification Example

In FIG. 5, the example of the switching between the first operation and the second operation along with the crystal growth has been explained. However, an example of the switching between the first operation and the second operation switched by the controller 50 is not limited to this example. For example, one of the first operation and the second operation can be performed at a stage of the crystal growth after the contact of the seed crystal to the surface of the solution, and the other one of the first operation and the second operation can be performed while the silicon carbide single crystal grown on the lower surface of the seed crystal is separated from the surface of the solution.

Figure 8:
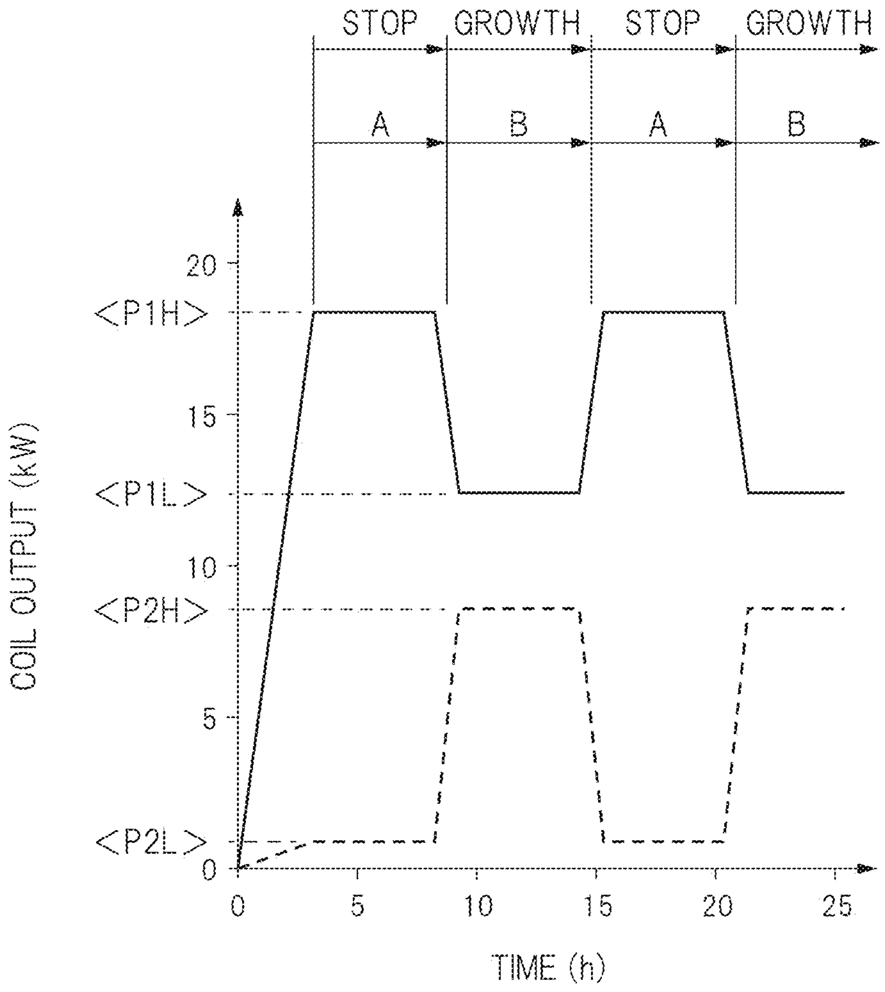
FIG. 8 is a diagram showing another example of the switching between the first operation and the second operation.

FIG. 8 is a diagram showing an example (second modification example) of the switching between the first operation and the second operation.

FIG. 8 shows an example in which the crystal growth is stopped when the first operation is performed while the second operation is performed along with the crystal growth. That is, a switching operation shown in FIG. 8 can be adopted as the example of the switching between the first operation and the second operation switched by the controller 50.

This case can provide the following advantages.

For example, in FIG. 6 showing the temperature distribution of the solution achieved by the first operation, the temperature of the surface of the solution 20 in contact with the seed crystal is high.

Here, in order to grow the silicon carbide single crystal on the lower surface of the seed crystal, the temperature of the surface of the solution in contact with the seed crystal is desirably set at a low temperature of the temperature distribution of the solution. This is because the supersaturation state in which the silicon carbide single crystal grows is achieved in the low temperature region. In consideration of this, it cannot be always said that the temperature distribution of the solution achieved by the first operation is the suitable temperature condition for the growth of the silicon carbide single crystal. This is because the temperature distribution shown in FIG. 6 delays the crystal growing speed because of making the supersaturation degree small, and, as a result, cannot be always said as the suitable temperature distribution for the crystal growth.

On the other hand, in FIG. 7 showing the temperature distribution of the solution achieved by the second operation, the temperature of the surface of the solution 20 in contact with the seed crystal is low. Therefore, it can be said that the temperature distribution of the solution achieved by the second operation is the suitable temperature condition for the growth of the silicon carbide single crystal. That is, the temperature distribution of the solution achieved by the second operation makes the crystal growing speed fast because of making the supersaturation degree large, and, as a result, can be said as the more suitable temperature distribution for the crystal growth than the temperature distribution of the solution achieved by the first operation.

As described above, the temperature distribution of the solution achieved by the first operation cannot be always said as the suitable temperature condition for the growth of the silicon carbide single crystal, and the temperature distribution of the solution achieved by the second operation can be said as the suitable temperature condition for the growth of the silicon carbide single crystal.

Thus, as shown in FIG. 8, when the crystal growth is stopped when the first operation is performed while the second operation is performed along with the crystal growth, the silicon carbide single crystal can be grown under only the suitable temperature condition for the growth of the silicon carbide single crystal. As a result, the present second modification example shown in FIG. 8 provides an advantage in that a silicon carbide single crystal having excellent quality can be manufactured. On the other hand, the switching example shown in FIG. 5 provides an advantage in that the manufacturing time of the silicon carbide single crystal can be shortened since the first operation and the second operation are alternately performed along with the crystal growth.

As described above, note that the method for determining the time of the switching between the first operation and the second operation based on the previously-built database is conceivable. However, in a point of view of shortening the crystal growing time, the performing time of the first operation is desirably made shorter than the performing time of the second operation. As an example, a suitable condition for providing the switching time that satisfies this purpose is, for example, to make a dissolution speed of the miscellaneous crystal in the solution 20 in contact with the side surface of the crucible 12 during the first operation to be higher than a precipitation speed of the miscellaneous crystal at the same position during the second operation. As a method for satisfying this condition, a method of adjusting the power supplied to each of the coil 14*a* and the coil 14*b* so as to make the larger temperature gradient of the temperature distribution of the solution 20 during the first operation than the temperature gradient of the temperature distribution during the second operation is conceivable.

In both the first operation and the second operation, the power supplied to the coils does not need to be completely constant, and may be gradually decreased. The first operation and the second operation in a second cycle and thereafter may not always provide the output supply power that is totally the same as that in a first cycle. For example, the output supply power may be slightly decreased from that of the first cycle, or the supply power may be slightly decreased for only the coil 14*a*. These methods are made in consideration of the decrease of the power supplied to the coil in order to create the same temperature distribution as that of the first cycle in view of the decrease of the solution amount to be heated along with the crystal growth.

Features of Embodiment

Next, features of the present embodiment will be explained.

A first feature of the present embodiment is, for example, the alternate switching between the first operation ("A") and the second operation ("B") as shown in FIGS. 5 and 8, the first operation ("A") making the temperature of the solution 20 in contact with the side surface of the crucible 12 to be higher than the temperature of the solution 20 in contact with the bottom surface of the crucible 12 by adjusting the power supplied to the heater 25*a* and the power supplied to the heater 25*b*, and the second operation ("B") making the temperature of the solution 20 in contact with the bottom surface of the crucible 12 higher than the temperature of the solution 20 in contact with the side surface of the crucible 12 by adjusting the power supplied to the heater 25*a* and the power supplied to the heater 25*b*. Thus, for example, the respective temperatures of the solution 20 in contact with the side surface and the bottom surface of the crucible 12 can be periodically changed between the temperature at which the miscellaneous crystal precipitates and the temperature at which the miscellaneous crystal dissolves. This means that the precipitated miscellaneous crystal can be reduced while the enormous miscellaneous crystal can be suppressed, which results in the suppression of the lowering in quality of the silicon carbide single crystal due to the miscellaneous crystal.

Next, a second feature of the present embodiment lies in that, for example, as shown in FIG. 1, the crucible 12 includes the heat transfer member 12*a* protruding out from the bottom of the main body of the crucible 12.

A technical significance of the second feature will be explained below.

For example, in the second operation in which the temperature of the solution 20 in contact with the bottom surface of the crucible 12 is raised to the temperature at which the miscellaneous crystal dissolves, it is important to evenly raise the temperature of the bottom surface of the crucible 12. This is because unless the temperature of the bottom surface of the crucible 12 can be evenly raised, the probability of the existence of the low temperature region where the miscellaneous crystal does not dissolve is made high even by the second operation, and as a result, the miscellaneous crystal in the region cannot be dissolved.

Figure 9:
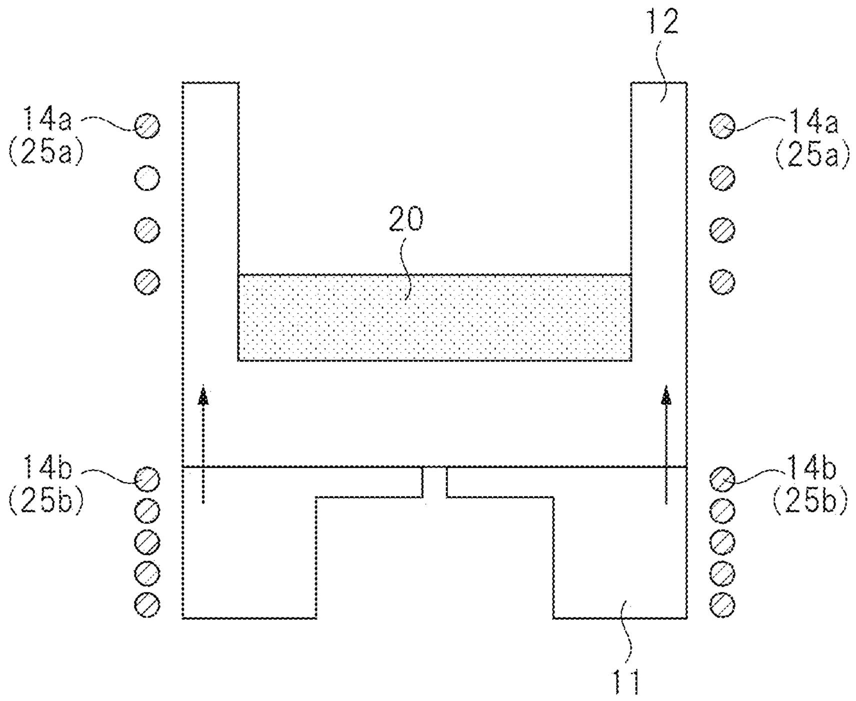
FIG. 9 is a diagram showing an example of a configuration heating the bottom surface of the crucible.

As a configuration for heating the bottom surface of the crucible 12, for example, a configuration shown in FIG. 9 can be considered. In FIG. 9, the crucible 12 is disposed on the base 11, and the base 11 is configured to be heated by the induction heating phenomenon made by the heater 25*b* including the coil 14*b*. This case has characteristics in which the heat from the heated base 11 is conducted to the bottom surface of the crucible 12 in direct contact with the base 11 while an outer side portion of the base 11 is easier to be heated than a central portion by the induction heating made by the coil 14*b*. Thus, in the configuration shown in FIG. 9, the outer side portion of the bottom surface of the crucible 12 is mainly heated (see an arrow in FIG. 9), and the central portion of the bottom surface of the crucible 12 is difficult to be heated. That is, in the configuration shown in FIG. 9, it is difficult to evenly raise the temperature of the bottom surface of the crucible 12.

Figure 10:
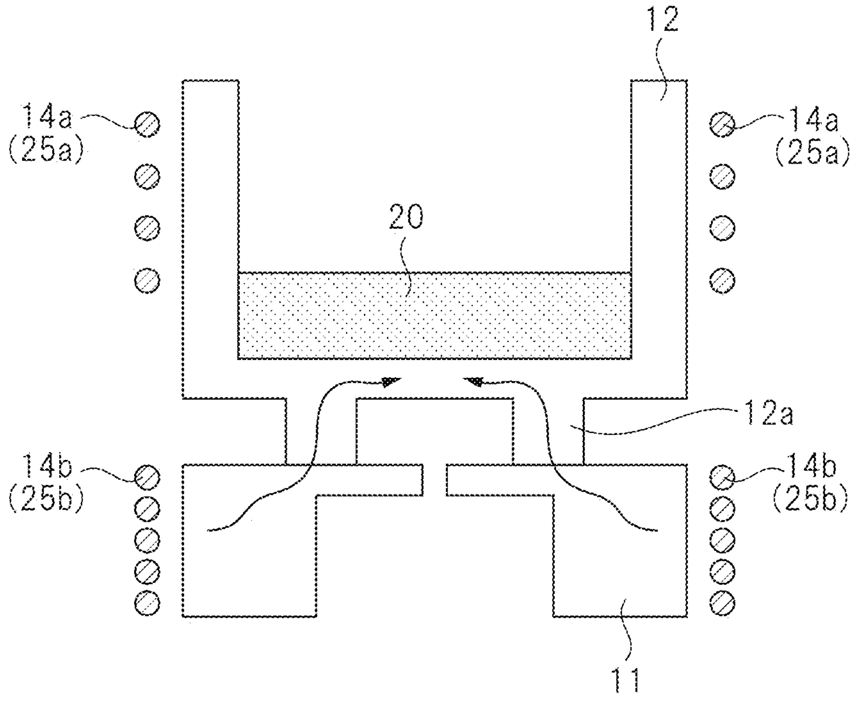
FIG. 10 is a diagram showing the configuration heating the bottom surface of the crucible in the embodiment.

On the contrary, in the present embodiment, as shown in FIG. 1, the crucible 12 includes the heat transfer member 12*a* protruding out from the bottom of the main body of the crucible 12. In this case, as shown in FIG. 10, the heat can be preferentially conducted from the base 11 heated by the induction heating phenomenon made from the heater 25*b* including the coil 14*b* to the central portion of the bottom surface of the crucible 12 through the heat transfer member 12*a*. As a result, according to the present embodiment, the temperature of the bottom surface of the crucible 12 can be evenly raised. That is, it can be said that the heat transfer member 12*a* has a function of preferentially guiding the heat from the heated base 11 to the central portion of the bottom surface of the crucible 12.

Here, in a point of view of improving the evenness of the temperature of the entire bottom surface of the crucible 12, for example, as shown in FIG. 1, it is desirable to provide the heat insulating member 13*a* to the inner side of the heat transfer member 12*a*, and to provide the heat insulating member 13*b* surrounding the heat transfer member 12*a*.

Note that a forming position of the heat transfer member 12*a* is important to evenly raise the temperature of the bottom surface of the crucible 12. In consideration of this point, for example, a dimension of a principal portion shown in FIG. 2 is determined.

In particular, in a point of view of allowing the miscellaneous crystal to be dissolved over the entire bottom surface by evenly raising the temperature of the entire bottom surface of the crucible 12, it is important that "L3" should be smaller than "L1" while "L4" should be larger than "L1" and smaller than "L2". The side surface of the crucible 12 can be avoided by this configuration from being preferentially heated.

Consideration of Further Improvement

For example, as shown in FIG. 1, the present embodiment is configured so that the crucible 12 is heated by the induction heating caused by the power supply to the coil 14*a*, and so that the base 11 is heated by the induction heating caused by the power supply to the coil 14*b*.

Here, as shown in FIGS. 5 and 8, the feature of the present embodiment is, for example, the alternate switching between the first operation ("A") and the second operation ("B"), the first operation ("A") making the temperature of the solution 20 in contact with the side surface of the crucible 12 to be higher than the temperature of the solution 20 in contact with the bottom surface of the crucible 12 by adjusting the power supplied to the coil 14*a* and the power supplied to the coil 14*b*, and the second operation ("B") making the temperature of the solution 20 in contact with the bottom surface of the crucible 12 to be higher than the temperature of the solution 20 in contact with the side surface of the crucible 12 by adjusting the power supplied to the coil 14*a* and the power supplied to the coil 14*b*.

In this case, as shown in FIGS. 5 and 8, the power is supplied to both the coil 14*a* and the coil 14*b* in both the first operation ("A") and the second operation ("B"). This means that the high frequency current is simultaneously flown in both the coil 14*a* and the coil 14*b* in both cases of the first operation ("A") and the second operation ("B"). Therefore, for example, the electromagnetic field generated by the high frequency current flown in the coil 14*a* may adversely affect the circuit including the coil 14*b*, and the electromagnetic field generated by the high frequency current flown in the coil 14*b* may adversely affect the circuit including the coil 14*a*. That is, since the high frequency current is simultaneously flown in both the coil 14*a* and the coil 14*b* in both the first operation ("A") and the second operation ("B"), there is a risk of occurrence of the electromagnetic interference due to this, which results in an adverse effect typified by malfunction of the circuit.

Therefore, the present embodiment adopts a contrivance for suppressing the adverse effect described above. A technical idea of the present embodiment adopting this contrivance will be described below.

Technical Idea of Embodiment

On an assumption of discontinuous power supply to each of the coil 14*a* and the coil 14*b* instead of the continuous power supply to each of the coil 14*a* and the coil 14*b*, the technical idea of the present embodiment is an idea of exclusively controlling the power supply so that a period of the power supply to the coil 14*a* and a period of the power supply to the coil 14*b* do not overlap each other. That is, the period for supplying the power to the coil 14*a* is a period for not supplying the power to the coil 14*b*, and the period for supplying the power to the coil 14*b* is a period for not supplying the power to the coil 14*a*. Thus, at the time of the power supply to one of the coils, the power is not supplied to the other coil, and thus, the high frequency current is prevented from being simultaneously flown in both coils. As a result, the electromagnetic interference due to the high frequency current simultaneously flown in both coils can be suppressed, and as a result, the malfunction of the circuit can be suppressed.

Figure 11A:
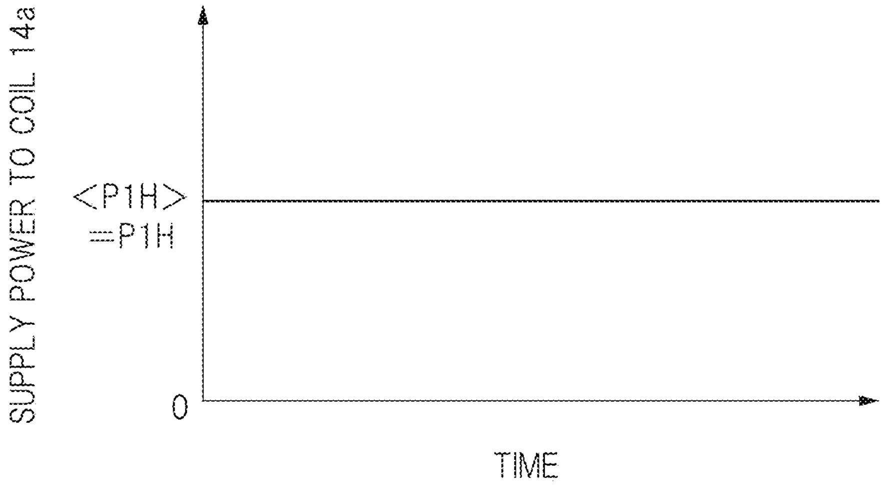
FIG. 11A is a schematic diagram showing power to be supplied to a first coil in a case of continuous power supply to the first coil.
Figure 11B:
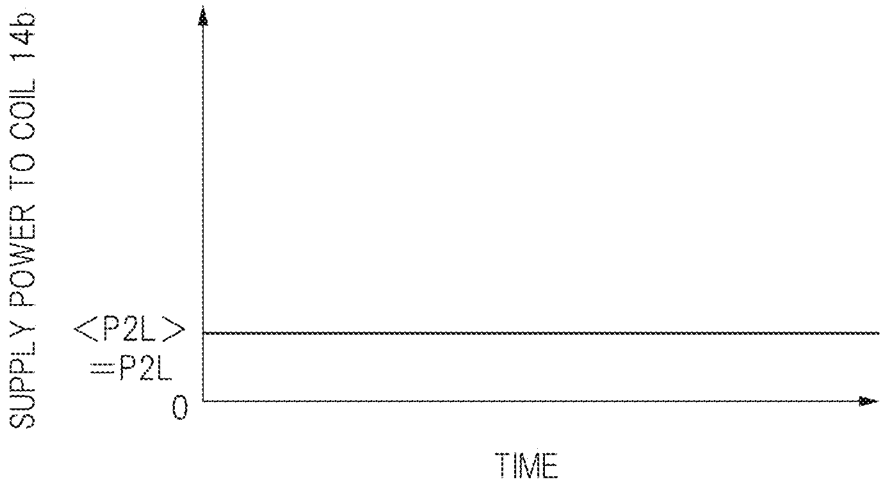
FIG. 11B is a schematic diagram showing power to be supplied to a second coil in a case of continuous power supply to the second coil.

For example, FIG. 11A is a schematic diagram showing the power supplied to the coil 14*a* in the case of the continuous power supply to the coil 14*a*. Meanwhile, FIG. 11B is a schematic diagram showing the power supplied to the coil 14*b* in the case of the continuous power supply to the coil 14*b*. In particular, FIG. 11A shows the power supplied to the coil 14*a* in the first operation ("A") of FIG. 5, and FIG. 11B shows the power supplied to the coil 14*b* in the first operation ("A") of FIG. 5. In this case, as shown in FIGS. 11A and 11B, it can be seen that the power is simultaneously supplied to both the coil 14*a* and the coil 14*b*. Therefore, it can be seen that the configuration of the continuous power supply to each of the coil 14*a* and the coil 14*b* as shown in FIGS. 11A and 11B causes the simultaneous flowing of the high frequency current in both the coil 14*a* and the coil 14*b*, and thus, there is the risk of occurrence of the electromagnetic interference due to this, which results in the adverse effect typified by the malfunction of the circuit.

In FIG. 11A, in the case of the continuous power supply to the coil 14*a*, an instantaneous supply power P1H to the coil 14*a* is equal to an average supply power <P1H> to the coil 14*a*. Similarly, in FIG. 11B, in the case of the continuous power supply to the coil 14*b*, an instantaneous supply power P2L to the coil 14*b* is equal to an average supply power <P2L> to the coil 14*b*.

Figure 12A:
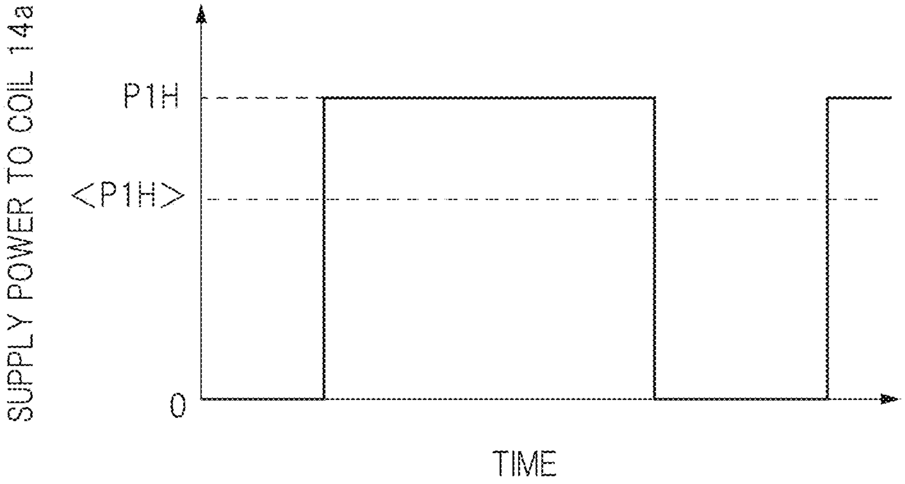
FIG. 12A is a schematic diagram showing power to be supplied to the first coil in a case of discontinuous power supply to the first coil.
Figure 12B:
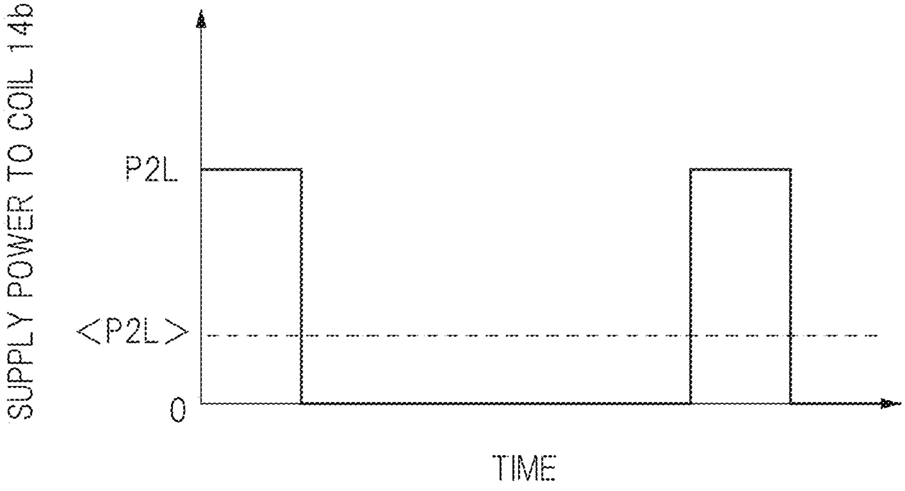
FIG. 12B is a schematic diagram showing power to be supplied to the second coil in a case of discontinuous power supply to the second coil.

On the other hand, for example, FIG. 12A is a schematic diagram showing the power supplied to the coil 14*a* in the case of the discontinuous power supply to the coil 14*a*. Meanwhile, FIG. 12B is a schematic diagram showing the power supplied to the coil 14*b* in the case of the discontinuous power supply to the coil 14*b*. In particular, FIG. 12A shows the power supplied to the coil 14*a* in the first operation ("A") of FIG. 5, and FIG. 12B shows the power supplied to the coil 14*b* in the first operation ("A") of FIG. 5. In this case, as shown in FIGS. 12A and 12B, the control can be made so as not to supply the power to the coil 14*b* in the period of the power supply to the coil 14*a*. That is, as shown in FIGS. 12A and 12B, it can be seen that the control can be made so as not to simultaneously supply the power to both the coil 14*a* and the coil 14*b* by the adoption of the configuration of the discontinuous power supply to each of the coil 14*a* and the coil 14*b*. Therefore, by the adoption of the configuration of the discontinuous power supply to each of the coil 14*a* and the coil 14*b* as shown in FIGS. 12A and 12B, the high frequency current can be prevented from being simultaneously flown in both the coil 14*a* and the coil 14*b*. Thus, the occurrence of the electromagnetic interference due to the simultaneous flowing of the high frequency current in both the coil 14*a* and the coil 14*b* can be suppressed, and as a result, the adverse effect typified by the malfunction of the circuit can be suppressed.

However, in FIG. 12A, in the case of the discontinuous power supply to the coil 14*a*, the instantaneous supply power P1H to the coil 14*a* becomes higher than the average supply power <P1H> to the coil 14*a*. Similarly, in FIG. 12B, in the case of the discontinuous power supply to the coil 14*b*, the instantaneous supply power P2L to the coil 14*b* becomes higher than the average supply power <P2L> to the coil 14*b*. In other words, by the adoption of the technical idea of the present embodiment, while the high frequency current can be prevented from being simultaneously flown in both the coil 14*a* and the coil 14*b*, the instantaneous supply power becomes higher than the average supply power. However, it can be said that the technical idea of the present embodiment has a very large technical significance in consideration of the fact that the electromagnetic interference due to the high frequency current simultaneously flown in both coils can be suppressed, which results in the suppression of the malfunction of the circuit.

Embodied Mode

An embodied mode provided by embodying the above-described technical idea will be explained below.

On the assumption of the discontinuous power supply to each of the coil 14*a* and the coil 14*b* instead of the continuous power supply to each of the coil 14*a* and the coil 14*b*, the embodied mode of the present embodiment is a mode of exclusively operating a first inverter for the power supply to the coil 14*a* and a second inverter for the power supply to the coil 14*b*. That is, when the first inverter for the power supply to the coil 14*a* is turned ON, the second inverter for the power supply to the coil 14*b* is turned OFF. On the other hand, when the second inverter for the power supply to the coil 14*b* is turned ON, the first inverter for the power supply to the coil 14*a* is turned OFF. Thus, since the power is not supplied to the other coil at the time of the power supply to one of the coils, the high frequency current can be prevented from being simultaneously flown in both coils. As a result, the electromagnetic interference due to the simultaneous flowing of the high frequency current in both coils can be suppressed, and as a result, the malfunction of the circuit can be suppressed.

Configuration and Operation of Heater

Figure 13:
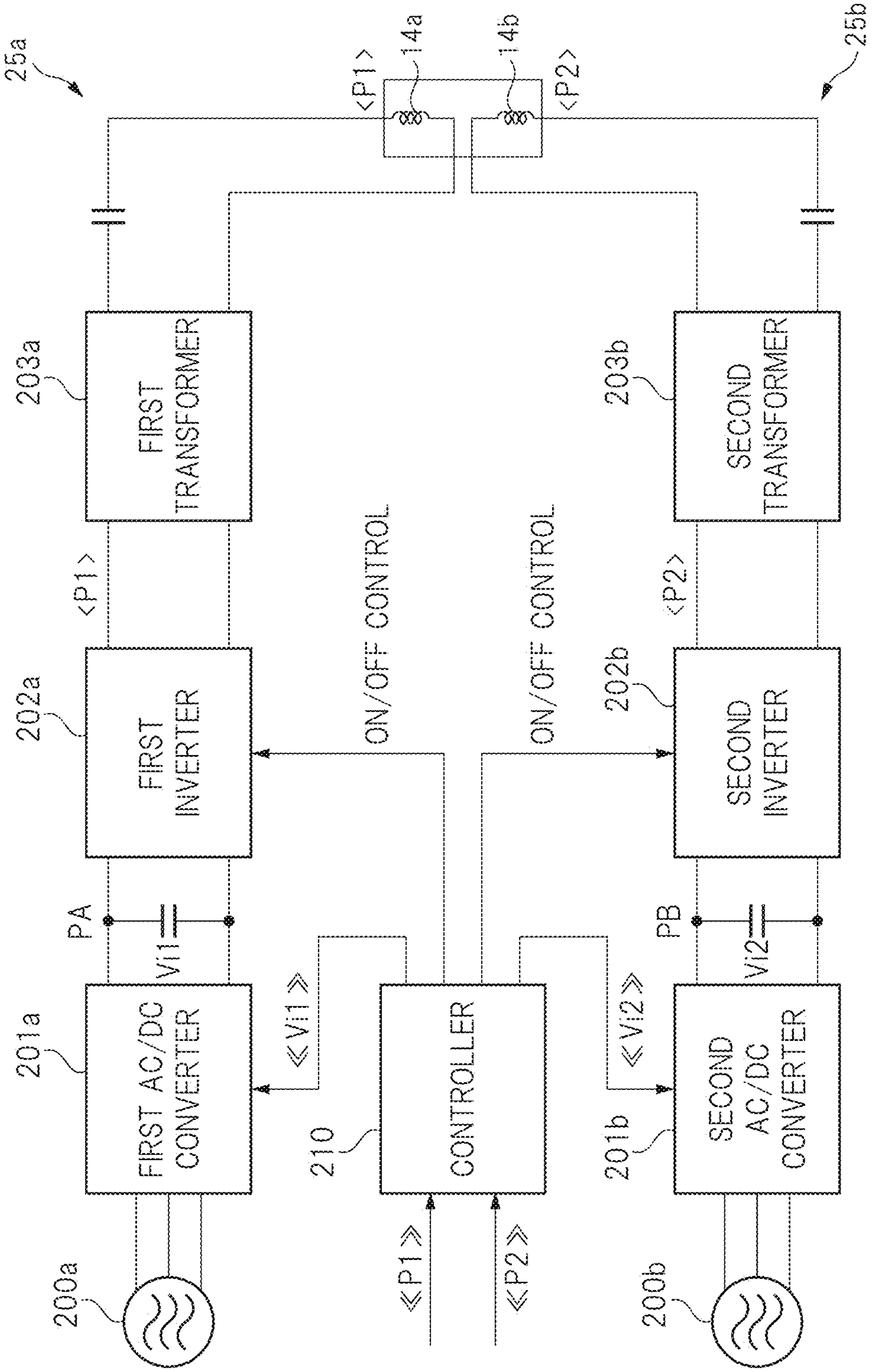
FIG. 13 is a block diagram showing a configuration of a heater in the embodiment.

FIG. 13 is a block diagram showing a configuration of the heaters in the present embodiment.

FIG. 13 shows a configuration example of the heater 25*a* and the heater 25*b*.

In FIG. 13, the heater 25*a* includes a first AC/DC converter 201*a*, a first inverter 202*a*, a first transformer 203*a* and a coil 14*a*, and is configured to be controlled by the controller 210. In the heater 25*a* configured as described above, first, a signal (i.e., target output signal) corresponding to a target output power <<P1>> is input to the controller 210. Then, to the first AC/DC converter 201*a*, the controller 210 outputs a target inverter voltage <<Vi1>> for achieving an input power PA to the first inverter 202*a*. Then, the first AC/DC converter 201*a* converts an alternating-current power output from a first commercial power supply 200*a* to a direct-current power, based on the target inverter voltage <<Vi1>> input from the controller 210. Thus, the input power PA is output from the first AC/DC converter 201*a* to the first inverter 202*a*. Then, after receiving the input power PA output from the first AC/DC converter 201*a* as input, the first inverter 202*a* outputs the output power <P1>. Specifically, the direct current converted by the first AC/DC converter 201*a* is converted to the high frequency current (e.g., 10 kHz) by the first inverter 202*a*. Then, the output voltage from the first inverter 202*a* is reduced by the first transformer 203*a*, and then, the high frequency current (output power <P1>) is supplied to the coil 14*a*. In other words, in order to prevent occurrence of electric leakage or arc in the heating furnace, the voltage is reduced by the first transformer 203*a* (transformer), and a large current by this amount is flown in the coil 14*a* to heat the heating furnace. At this time, the controller 210 performs the control to turn the first inverter 202*a* ON/OFF. Thus, the coil 14*a* has a period in which the power is supplied and a power in which the power is not supplied. Then, the induction heating to the crucible 12 is performed in the coil 14*a*, based on the supplied output power <P1>. The crucible 12 is heated by the heater 25*a* as described above.

Next, the heater 25*b* includes a second AC/DC converter 201*b*, a second inverter 202*b*, a second transformer 203*b* and a coil 14*b*, and is configured to be controlled by the controller 210. In the heater 25*b* configured as described above, first, a signal corresponding to a target output power <<P2>> is input to the controller 210. Then, to the second AC/DC converter 201*b*, the controller 210 outputs a target inverter voltage <<Vi2>> for achieving an input power PB to the second inverter 202*b*. Then, the second AC/DC converter 201*b* converts an alternating-current power output from a second commercial power supply 200*b* to a direct-current power, based on the target inverter voltage <<Vi2>> input from the controller 210. Thus, the input power PB is output from the second AC/DC converter 201*b* to the second inverter 202*b*. Then, after receiving the input power PB output from the second AC/DC converter 201*b* as input, the second inverter 202*b* outputs the output power <P2>. Specifically, the direct current converted by the second AC/DC converter 201*b* is converted to the high frequency current (e.g., 10 kHz) by the second inverter 202*b*. Then, the output voltage from the second inverter 202*b* is reduced by the second transformer 203*b*, and then, the high frequency current (output power <P2>) is supplied to the coil 14*b*. In other words, in order to prevent occurrence of electric leakage or arc in the heating furnace, the voltage is reduced by the second transformer 203*b* (transformer), and a large current by this amount is flown in the coil 14*b* to heat the heating furnace. At this time, the controller 210 performs the control to turn the second inverter 202*b* ON/OFF. Thus, the coil 14*b* has a period in which the power is supplied and a power in which the power is not supplied. Then, the induction heating to the base 11 is performed in the coil 14*b*, based on the supplied output power <P2>. The base 11 is heated by the heater 25*b* as described above.

Thus, in the embodied mode, the power is discontinuously supplied instead of the continuous power supply to each of the coil 14*a* and the coil 14*b*. At this time, the first inverter 202*a* and the second inverter 202*b* are controlled by the controller 210 so as to exclusively operate the first inverter 202*a* for the power supply to the coil 14*a* and the second inverter 202*b* for the power supply to the coil 14*b*. That is, when the first inverter 202*a* for the power supply to the coil 14*a* is turned ON, the second inverter 202*b* for the power supply to the coil 14*b* is turned OFF. On the other hand, when the second inverter 202*b* for the power supply to the coil 14*b* is turned ON, the first inverter 202*a* for the power supply to the coil 14*a* is turned OFF. Thus, since the power is not supplied to the other coil at the time of the power supply to one of the coils, the high frequency current can be prevented from being simultaneously flown in both coils. As a result, the electromagnetic interference due to the simultaneous flowing of the high frequency current in both coils can be suppressed, and as a result, the malfunction of the circuit can be suppressed.

Specific Waveform Example

Next, a specific waveform example will be described.

Figure 14A:
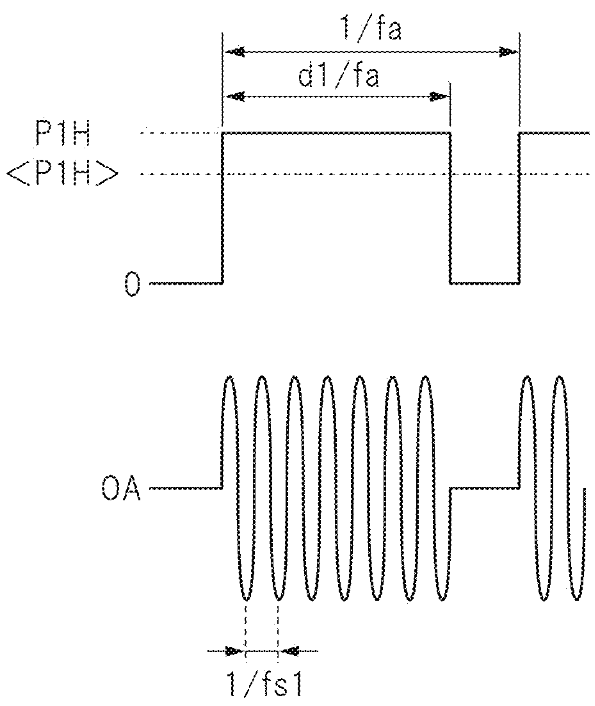
FIG. 14A is a schematic diagram showing power to be supplied to the first coil in the case of discontinuous power supply to the first coil.
Figure 14B:
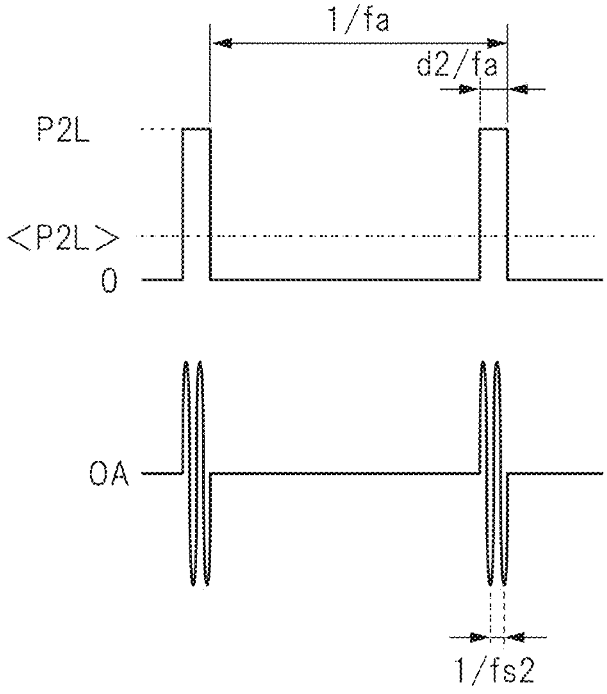
FIG. 14B is a schematic diagram showing power to be supplied to the second coil in the case of discontinuous power supply to the second coil.

FIG. 141A is a schematic diagram showing the power supplied to the coil 14*a* in the case of the discontinuous power supply to the coil 14*a*. Meanwhile, FIG. 14B is a schematic diagram showing the power supplied to the coil 14*b* in the case of the discontinuous power supply to the coil 14*b*. In particular, FIG. 14A shows the power supplied to the coil 14*a* in the first operation ("A") of FIG. 5, and FIG. 14B shows the power supplied to the coil 14*b* in the first operation ("A") of FIG. 5. Note that a lower side of FIG. 14A also shows a current waveform flown in the coil 14*a*, and a lower side of FIG. 14B also shows a current waveform flown in the coil 14*b*.

Here, reference signs in FIGS. 14A and 14B represent the following meaning:

P1H: the instantaneous supply power to the coil 14*a*
P2L: the instantaneous supply power to the coil 14*b*
<P1H>: the average supply power to the coil 14*a*
<P2L>: the average supply power to the coil 14*b*
fa: an ON/OFF switching frequency
fs1: a frequency of current flown in the coil 14*a*
fs2: a frequency of current flown in the coil 14*b*
d1: an ON-time ratio of the coil 14*a*
d2: an ON-time ratio of the coil 14*b*

Note that a relationship of "d1+d2<1" is met. That is, there is a period in which the first inverter and the second inverter are turned OFF at the same time.

Figure 15A:
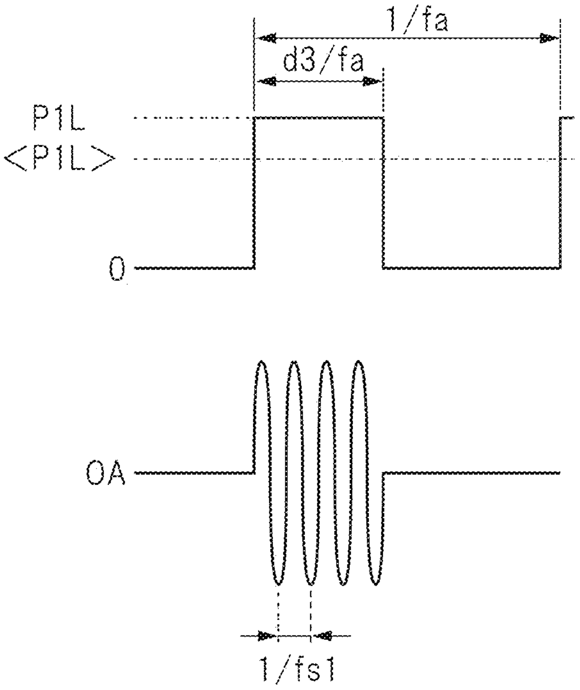
FIG. 15A is a schematic diagram showing power to be supplied to the first coil in the case of discontinuous power supply to the first coil.
Figure 15B:
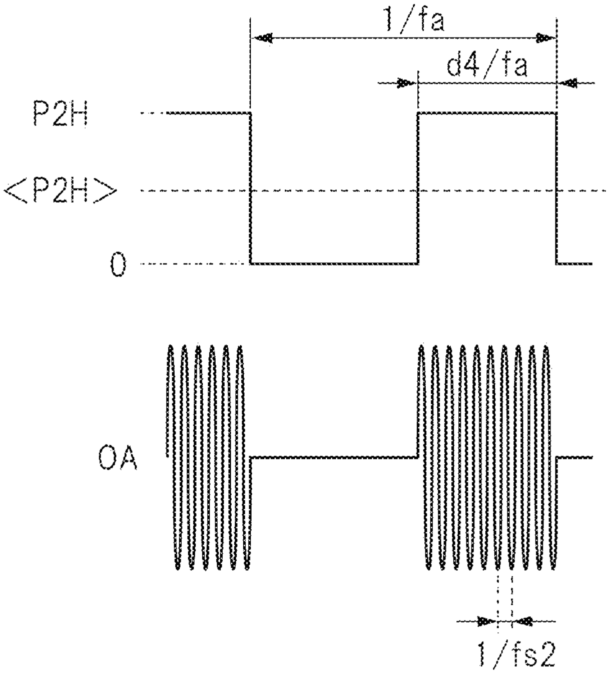
FIG. 15B is a schematic diagram showing power to be supplied to the second coil in the case of discontinuous power supply to the second coil.

FIG. 15A shows the power supplied to the coil 14*a* in the second operation ("B") of FIG. 5 and FIG. 15B shows the power supplied to the coil 14*b* in the second operation ("B") of FIG. 5. The current waveform flowing to the coil 14*a* is also shown in FIG. 15A, and the current waveform flowing to the coil 14*b* is also shown in FIG. 15B.

Here, reference signs in FIGS. 15A and 15B represent the following meaning:

P1L: the instantaneous supply power to the coil 14*a*
P2H: the instantaneous supply power to the coil 14*b*
<P1L>: the average supply power to the coil 14*a*
<P2H>: the average supply power to the coil 14*b*
fa: an ON/OFF switching frequency
fs1: a frequency of current flown in the coil 14*a*
fs2: a frequency of current flown in the coil 14*b*
d3: an ON-time ratio of the coil 14*a*
d4: an ON-time ratio of the coil 14*b*

Note that a relationship of "d3+d4<1" is met. That is, there is a period in which the first inverter and the second inverter are turned OFF at the same time.

In FIG. 14, the first operation ("A") of FIGS. 5 and 8 can be achieved when "d1", "d2", "P1H", and "P2L" are given so that <P1H> matches with the solid line in FIGS. 5 and 8, and so that <P2L> matches with the broken line in FIGS. 5 and 8. Similarly, in FIG. 15, the second operation ("B") of FIGS. 5 and 8 can be achieved when "d3", "d4", "P1L", and "P2H" are given so that <P1L> matches with the solid line in FIGS. 5 and 8, and so that <P2H> matches with the broken line in FIGS. 5 and 8.

In the present embodiment, the power supplying operations to the coil 14*a* and the coil 14*b* are the intermittent operations, but the intermittent operations do not affect the temperature change of the furnace if the ON/OFF switching frequency "fa" is sufficiently shorter than the time constant of the temperature change of the furnace. Furthermore, the induction heating is achieved if the switching frequency of the first inverter 202*a* (frequency fs1 of the current flown in the coil 14*a*) and the switching frequency of the second inverter 202*b* (frequency fs2 of the current flown in the coil 14*b*) are sufficiently higher than the ON/OFF switching frequency fa.

Therefore, as shown in FIGS. 5 and 8, when the output of one of the coils exists, the output of the other coil is not zero. However, by the exclusive operation shown in FIG. 14 or FIG. 15, the power supply to the other coil can be paused at the time of the power supply to one of the coils along with the achievement of the output of FIGS. 5 and 8. Therefore, by the exclusive operation for the first inverter 202*a* that flows the current to the coil 14*a* and the second inverter 202*b* that flows the current to the coil 14*b*, the malfunction of the first inverter 202*a* or the second inverter 202*b* due to the electromagnetic interference can be avoided, and as a result, stable operation can be performed. The present embodiment can suppress the electromagnetic interference, and thus, it is unnecessary to arrange a magnetic shield between the coil 14*a* and the coil 14*b*, and thus, a cost of the single crystal manufacturing apparatus can be reduced.

Another Features

Next, another feature of the present embodiment will be explained.

As shown in FIG. 1, for example, in the single crystal manufacturing apparatus 100 of the present embodiment, the heater 25*a* includes the coil 14*a* provided at a position facing the side surface of the crucible 12 disposed on the base 11, and the heater 25*b* includes the coil 14*b* provided at a position facing the base 11 below the crucible 12 containing the solution 20. With regards to this, another feature of the present embodiment lies in that the coil 14*b* is provided at a position facing the base 11 lower than the solution 20 contained in the crucible 12.

Therefore, the heater 25*b* can heat the base 11 by using the induction heating phenomenon that is caused by the flowing of the high frequency current in the coil 14*b* provided at a position facing the base 11. Then, the bottom surface of the crucible 12 can be heated by the heat conduction from the heated base 11.

Specifically, the heat is transferred from the base 11 heated by the heater 25*b* to the heat transfer member 12*a*, and then, the heat is transferred from the heat transfer member 12*a* to the crucible 12 (main body) to heat the bottom surface of the crucible 12 in contact with the solution 20. That is, the heater 25*b* is configured to indirectly heat the bottom surface of the crucible 12 in contact with the solution through the base 11 by using the induction heating phenomenon that is caused by the flowing of the high frequency current to the coil 14*b* provided at the position facing the base 11 supporting the crucible 12. Thus, another feature lies in that the coil 14*b* is provided at the position facing the base 11 lower than the solution 20 contained in the crucible 12 so that the bottom surface of the crucible 12 in contact with the solution 20 can be heated by the coil 14*b* disposed on the outer side surface of the heat insulating member 13*c*.

As a result, according to the other features, the base 11 can be heated by the induction heating phenomenon that is caused by the flowing of the high frequency current in the coil 14*b*, and the bottom surface of the crucible 12 in contact with the solution 20 can be indirectly heated by the heat conduction from the heated base 11. That is, the technical significance of another feature is the configuration in which the bottom surface of the crucible 12 is indirectly heated through the base 11 by adopting the configuration of disposing (another feature) the coil 14*b* at the position facing the base 11 and heating not the crucible 12 itself but the base 11 where the crucible 12 is disposed, instead of directly heating the bottom surface of the crucible 12 in contact with the solution 20.

Still Another Feature

As described above, the first feature of the present embodiment is, for example, the alternate switching between the first operation ("A") and the second operation ("B") as shown in FIGS. 5 and 8, the first operation ("A") making the temperature of the solution 20 in contact with the side surface of the crucible 12 to be higher than the temperature of the solution 20 in contact with the bottom surface of the crucible 12 by adjusting the power supplied to the heater 25*a* and the power supplied to the heater 25*b*, and the second operation ("B") making the temperature of the solution 20 in contact with the bottom surface of the crucible 12 to be higher than the temperature of the solution 20 in contact with the side surface of the crucible 12 by adjusting the power supplied to the heater 25*a* and the power supplied to the heater 25*b*.

With regards to this, the present embodiment includes still another feature regarding the adjustments of the power supplied to the heater 25*a* and the power supplied to the heater 25*b*. That is, still another feature is to make difference between the supply power to the heater 25*a* and the supply power to the heater 25*b* to achieve each of the first operation and the second operation described above. In other words, still another feature is achievement of each of the first operation and the second operation by simply adopting a configuration of making the difference between the power supplied to the heater 25*a* and the power supplied to the heater 25*b*. As a specific example, as shown in FIGS. 5 to 8, in order to achieve the first operation, the "first power" supplied to the heater 25*a* is made larger than the "second power" supplied to the heater 25*b*. On the other hand, in order to achieve the second operation, the "third power" supplied to the heater 25*a* is made larger than the "fourth power" supplied to the heater 25*b*. In this case, the "first power" is larger than the "third power", and the "second power" is smaller than the "fourth power". Thus, in the specific example, each of the first operation and the second operation can be achieved.

Thus, according to still another feature, the respective temperatures of the solution 20 in contact with the side surface and the bottom surface of the crucible 12 can be periodically changed between the temperature at which the miscellaneous crystal precipitates and the temperature at which the miscellaneous crystal dissolves by simply making the difference between the power supplied to the heater 25*a* and the power supplied to the heater 25*b*. As a result, the present embodiment can reduce the precipitating miscellaneous crystal and suppress the enormous miscellaneous crystal, and as a result, the decrease in quality of the silicon carbide single crystal due to the miscellaneous crystal can be suppressed.

Verification of Effect Based on Experimental Result

Next, the reduction of the miscellaneous crystal generated in the solution by the present embodiment will be explained based on not the simulation result but a practical experimental result.

For example, as shown in FIGS. 5 and 8, the feature of the present embodiment is, for example, the alternate switching between the first operation ("A") and the second operation ("B") as shown in FIGS. 5 and 8, the first operation ("A") making the temperature of the solution 20 in contact with the side surface of the crucible 12 to be higher than the temperature of the solution 20 in contact with the bottom surface of the crucible 12 by adjusting the power supplied to the heater 25*a* and the power supplied to the heater 25*b*, and the second operation ("B") making the temperature of the solution 20 in contact with the bottom surface of the crucible 12 to be higher than the temperature of the solution 20 in contact with the side surface of the crucible 12 by adjusting the power supplied to the heater 25*a* and the power supplied to the heater 25*b*.

Hereinafter, the first operation (first heating step) described above is referred to as "side surface heating", and the second operation (second heating step) described above is referred to as "bottom surface heating". Furthermore, the operation (that is the feature of the present embodiment) of the alternate switching between the first operation and the second operation is referred to as "heating switching".

Figure 16:
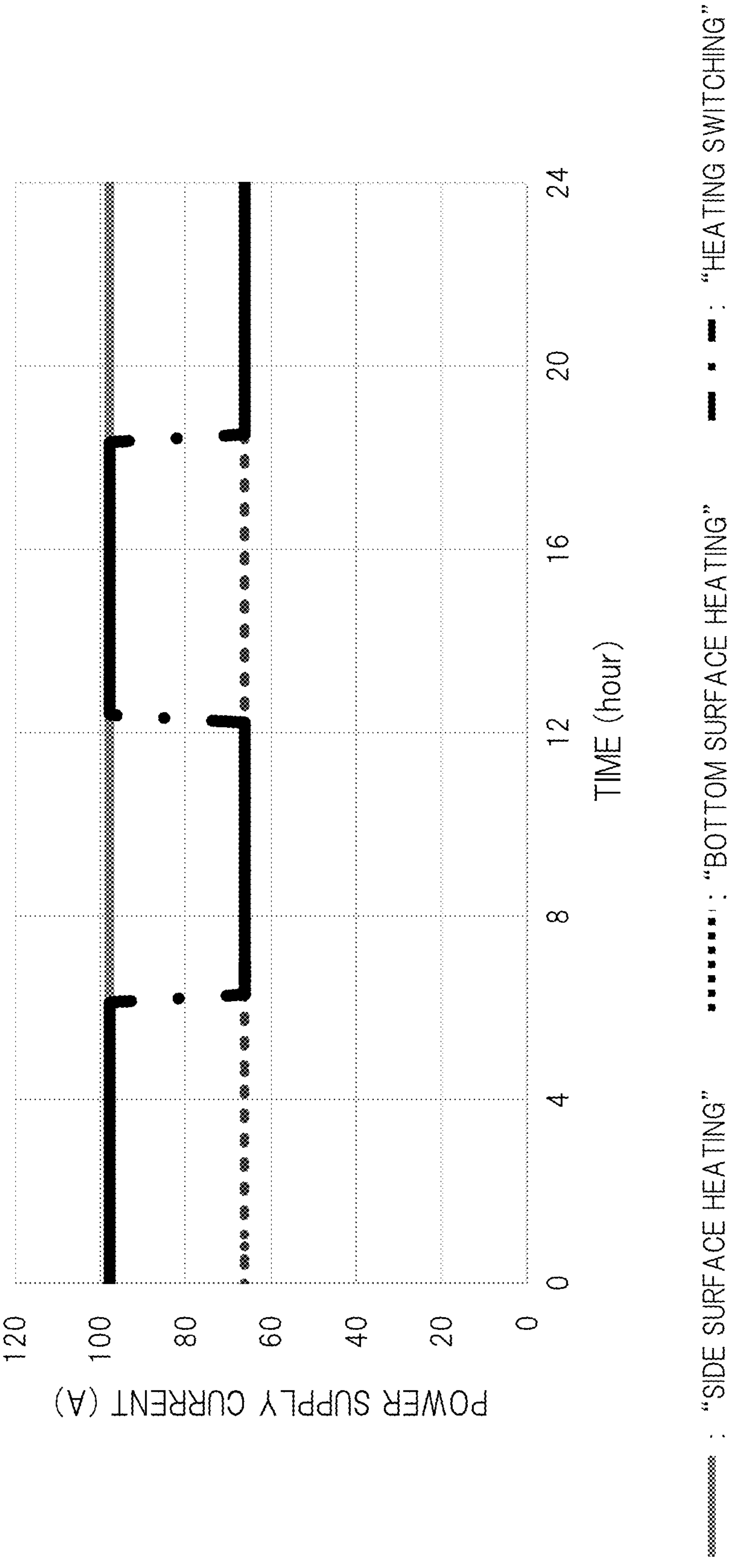
FIG. 16 is a graph showing a power supply current to be supplied to the first coil in an experiment.

FIG. 16 is a graph showing a power supply current supplied to the coil 14*a* in the experiment. In FIG. 16, a horizontal axis indicates time (hour), and a vertical axis indicates a value (A) of the power supply current supplied to the coil 14*a*.

In FIG. 16, a solid line indicates a relationship between the power supply current and the time in the "side surface heating". A dotted line indicates a relationship between the power supply current and the time in the "bottom surface heating", and a dashed dotted line indicates a relationship between the power supply current and the time in the "heating switching".

Figure 17:
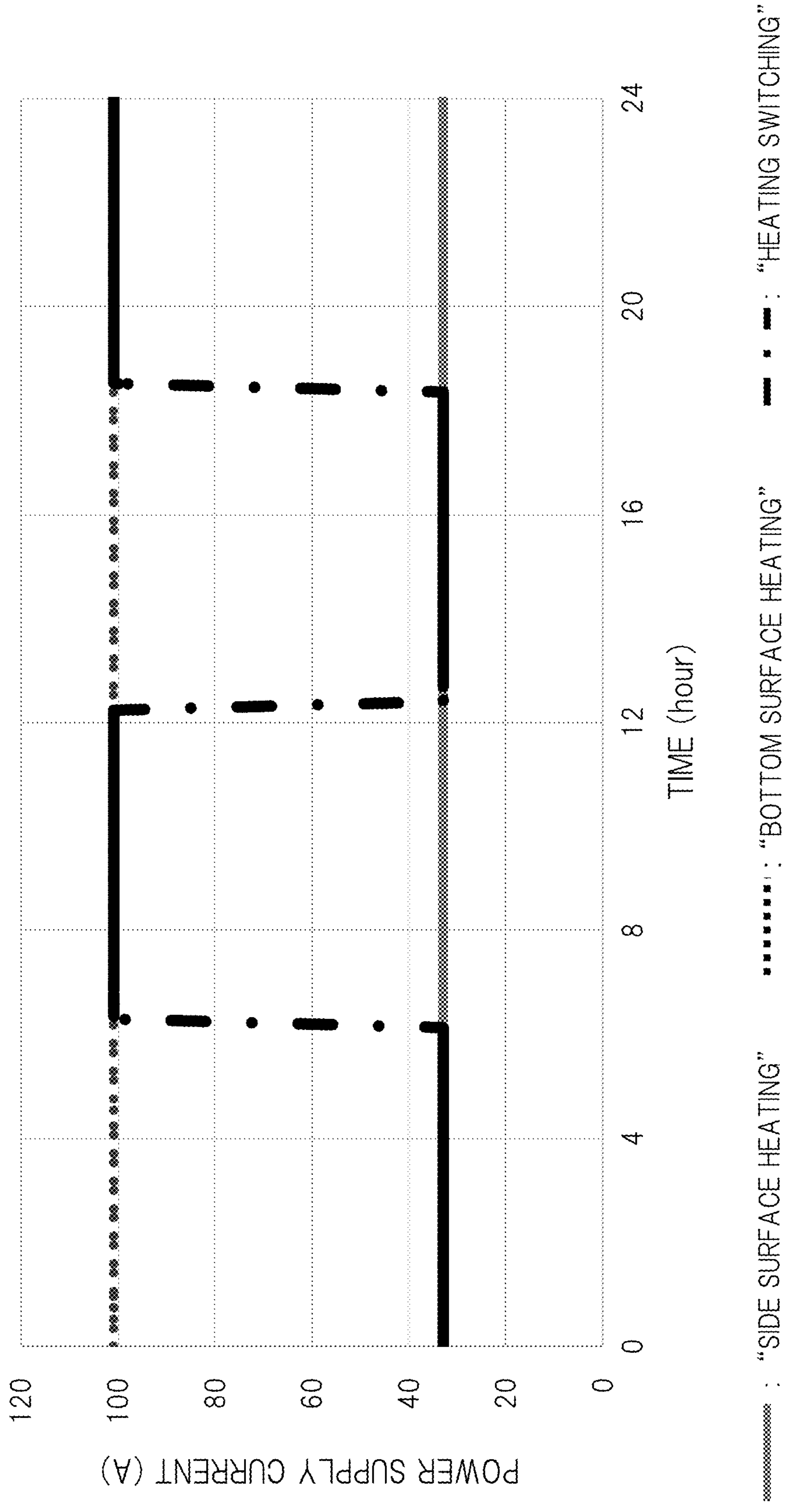
FIG. 17 is a graph showing a power supply current to be supplied to the second coil in an experiment.

FIG. 17 is a graph showing a power supply current supplied to the coil 14*b* in the experiment. In FIG. 17, A horizontal axis indicates time (hour), and A vertical axis indicates A value (A) of the power supply current supplied to the coil 14*b*.

In FIG. 17, A solid line indicates A relationship between the power supply current and the time in the "side surface heating". a dotted line indicates A relationship between the power supply current and the time in the "bottom surface heating", and a dashed dotted line indicates A relationship between the power supply current and the time in the "heating switching".

The experiment was conducted under the conditions shown in FIGS. 16 and 17 described above. The power supply current was switched at the timing of the side surface heating of 6 hours, the switching of 10 minutes, the bottom surface heating of 5 hours 50 minutes, the switching of 10 minutes, the side surface heating of 5 hours 50 minutes, the switching of 10 minutes, and the bottom surface heating of 5 hours 50 minutes. After the solution contained in the crucible was cooled and solidified, cross-sectional diagrams resulted from cutting of the crucible were acquired. The experimental result will be explained below with reference to the cross-sectional diagrams acquired as described above.

Figure 18:
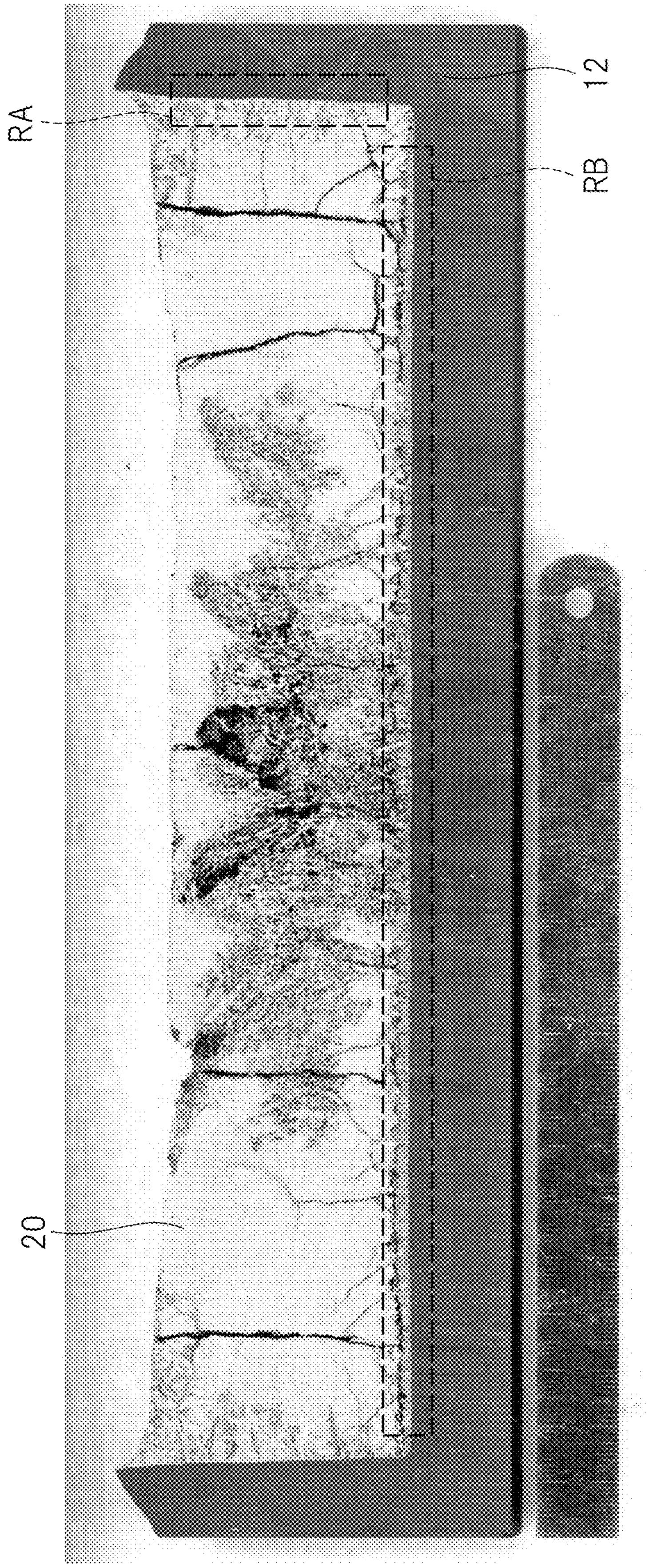
FIG. 18 is a cross-sectional diagram of a crucible containing a solidified solution in a side surface heating.

FIG. 18 is a cross-sectional diagram of the crucible 12 containing the solidified solution 20 in the "side surface heating". In FIG. 18, in a region RA of the side surface of the crucible 12, it was confirmed that no miscellaneous crystal was observed while the side surface of the crucible 12 dissolved by about 3 mm at a maximum. On the other hand, in a region RB of the bottom surface of the crucible 12, the miscellaneous crystal of about 2 mm was observed.

In the "side surface heating", the temperature of the solution 20 in contact with the side surface of the crucible 12 becomes higher than the temperature of the solution 20 in contact with the bottom surface of the crucible 12, and therefore, this result would be qualitatively understood since the miscellaneous crystal dissolves on the side surface of the crucible 12 while the miscellaneous crystal precipitates on the bottom surface of the crucible 12.

Figure 19:
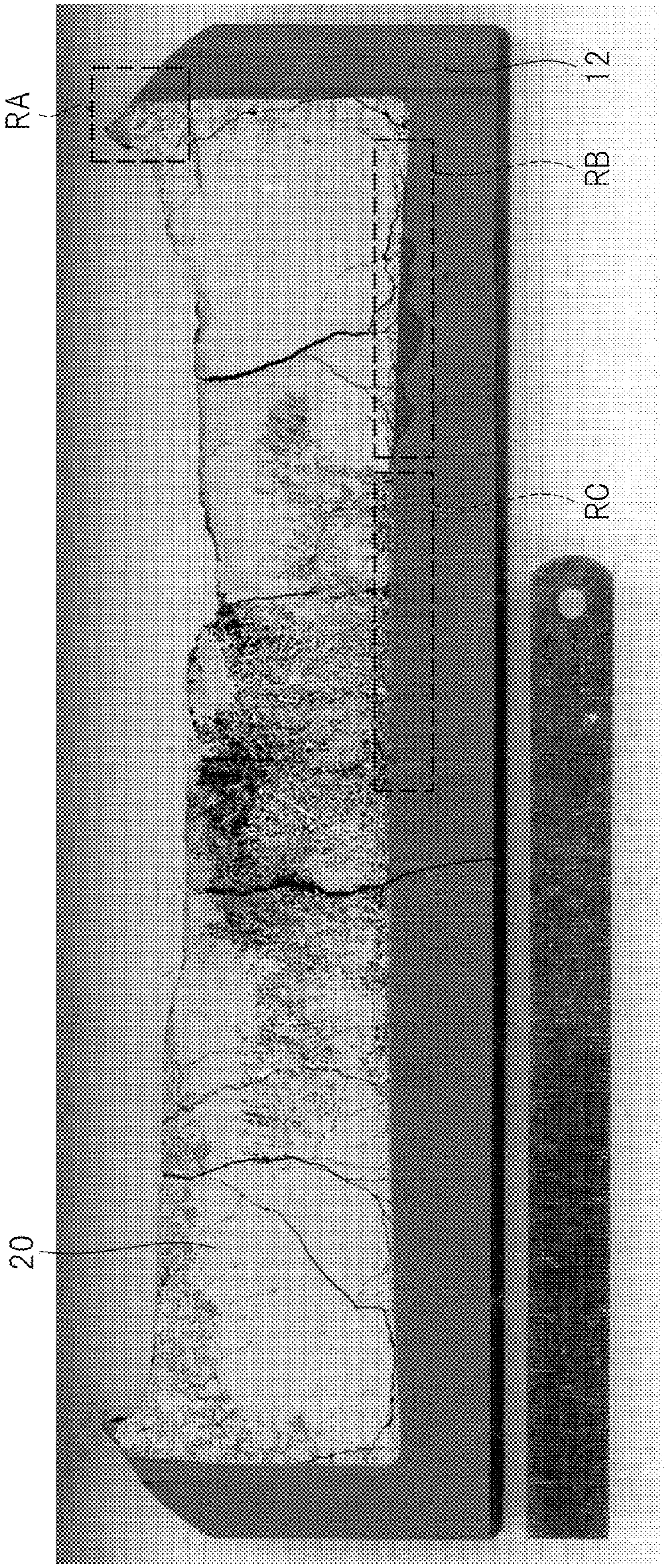
FIG. 19 is a cross-sectional diagram of the crucible containing the solidified solution in a bottom surface heating.

Next, FIG. 19 is a cross-sectional diagram of the crucible 12 containing the solidified solution 20 in the "bottom surface heating". In FIG. 19, in the region RA of the side surface of the crucible 12, it was confirmed that a miscellaneous crystal having a large size of about 5 mm was observed. On the other hand, in the region RB of the bottom surface of the crucible 12, it was confirmed that no miscellaneous crystal was observed while the bottom surface of the crucible 12 dissolved by about 4 mm at a maximum. Furthermore, in a region RC of the bottom surface of the crucible 12, a miscellaneous crystal of about 1 mm was observed.

In the "bottom surface heating", the temperature of the solution 20 in contact with the bottom surface of the crucible 12 becomes higher than the temperature of the solution 20 in contact with the side surface of the crucible 12, and therefore, this result would be qualitatively understood since the miscellaneous crystal dissolves on the bottom surface of the crucible 12 while, even if a miscellaneous crystal is generated, a miscellaneous crystal having a small size is generated.

Figure 20:
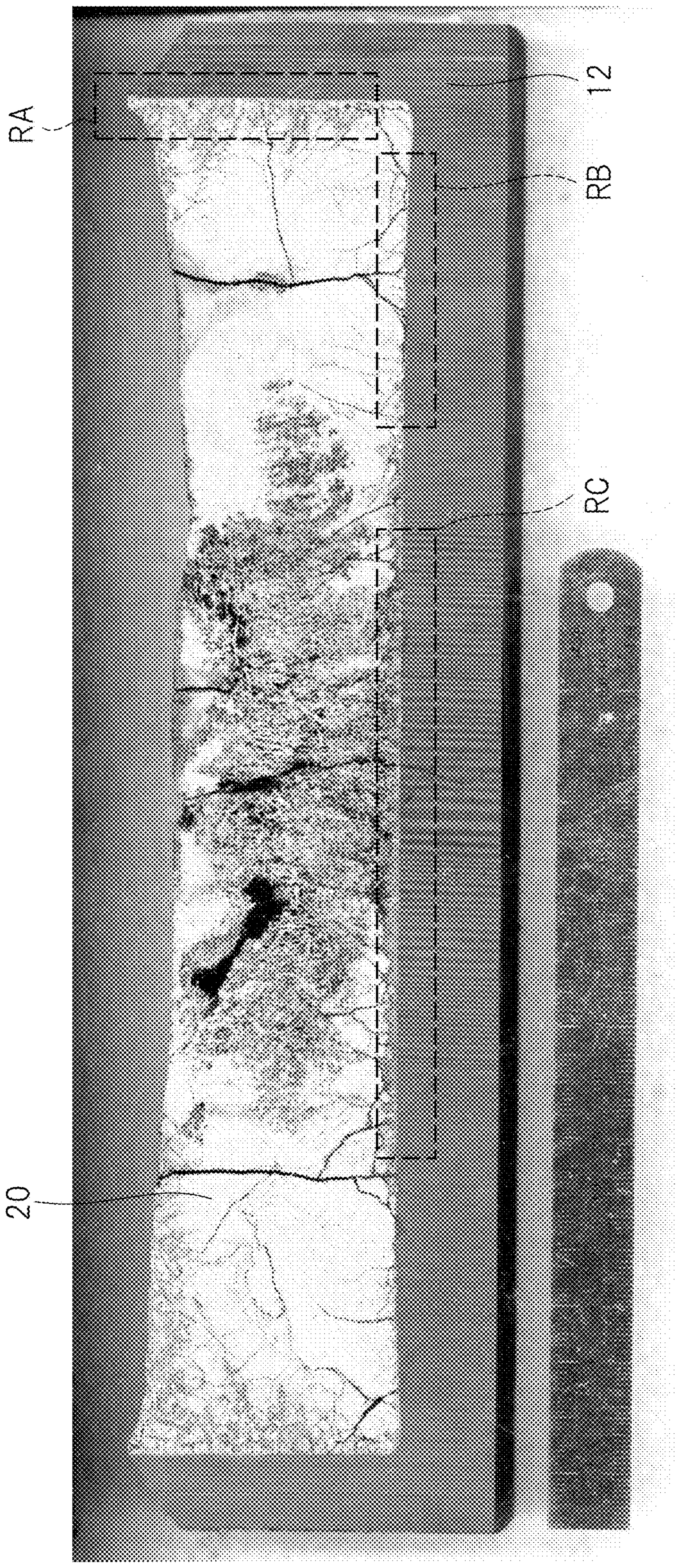
FIG. 20 is a cross-sectional diagram of the crucible containing the solidified solution in a heating switching.

Next, FIG. 20 is a cross-sectional diagram of the crucible 12 containing the solidified solution 20 in the "heating switching". In FIG. 20, in the region RA of the side surface of the crucible 12, a miscellaneous crystal having a small size was observed while the side surface of the crucible 12 dissolved by about 1 mm at a maximum. On the other hand, in the region RB of the bottom surface of the crucible 12, it was confirmed that no miscellaneous crystal was observed while the bottom surface of the crucible 12 dissolved by about 2 mm at a maximum. Furthermore, in the region RC of the bottom surface of the crucible 12, a miscellaneous crystal of about 1 mm was observed.

In the "heating switching", the first operation and the second operation are alternately switched, the first operation making the temperature of the solution 20 in contact with the side surface of the crucible 12 to be higher than the temperature of the solution 20 in contact with the bottom surface of the crucible 12, and the second operation making the temperature of the solution 20 in contact with the bottom surface of the crucible 12 to be higher than the temperature of the solution 20 in contact with the side surface of the crucible 12. Thus, in the "heating switching", the respective temperatures of the solution 20 in contact with the side surface and the bottom surface of the crucible 12 can be periodically changed between the temperature at which the miscellaneous crystal precipitates and the temperature at which the miscellaneous crystal dissolves. Therefore, as shown in the experimental results shown in FIGS. 18 to 20, it can be qualitatively understood that the precipitated miscellaneous crystal can be reduced and the enormous miscellaneous crystal can be suppressed, and besides, the dissolution of the crucible 12 can be suppressed in the "heating switching" more than the "side surface heating" and the "bottom surface heating".

On the basis of the above-described experimental results, it was verified that the precipitated miscellaneous crystal can be reduced and the enormous miscellaneous crystal can be suppressed, and besides, the dissolution of the crucible 12 can be suppressed in the "heating switching" more than the "side surface heating" and the "bottom surface heating". Therefore, from the experimental results, it was verified that the basic idea of the present embodiment is a technical idea that is effective in that the decrease in quality of the silicon carbide single crystal due to the miscellaneous crystal can be suppressed (for example, in that the silicon carbide single crystal without the miscellaneous crystal can be formed).

In the foregoing, the invention made by the present inventors has been concretely described on the basis of the embodiments. However, it is needless to say that the present invention is not limited to the foregoing embodiments, and various modifications can be made within the scope of the present invention.

What is claimed is:

1. A single crystal manufacturing method comprising the steps of:

(a) by moving a shaft having a seed crystal attached to its tip downward, bringing a lower surface of the seed crystal into contact with a solution including carbon and silicon contained in a crucible; and (b) growing a single crystal made of silicon carbide on the lower surface of the seed crystal, wherein the step (b) includes:

(c1) a first heating step of heating the solution so that a temperature of the solution in contact with a side surface of the crucible becomes higher than a temperature of the solution in contact with a bottom surface of the crucible; and (c2) a second heating step of heating the solution so that a temperature of the solution in contact with the bottom surface of the crucible becomes higher than a temperature of the solution in contact with the side surface of the crucible, wherein the first heating step and the second heating step are alternately switched, and wherein in both the first heating step and the second heating step, the single crystal grows on the lower surface of the seed crystal.

2. The single crystal manufacturing method according to claim 1, wherein, in the first heating step, the temperature of the solution in contact with the side surface of the crucible is a temperature at which a miscellaneous crystal present in the solution and on the side surface dissolves, and the temperature of the solution in contact with the bottom surface of the crucible is a temperature at which a miscellaneous crystal present in the solution and on the bottom surface precipitates, and, in the second heating step, the temperature of the solution in contact with the bottom surface of the crucible is a temperature at which a miscellaneous crystal present in the solution and on the bottom surface dissolves, and the temperature of the solution in contact with the side surface of the crucible is a temperature at which a miscellaneous crystal present in the solution and on the side surface precipitates.

3. The single crystal manufacturing method according to claim 1, wherein the first heating step and the second heating step are alternately switched at a preset time interval.

* * * * *